(12) United States Patent
Hamamoto et al.

(10) Patent No.: US 10,209,614 B2
(45) Date of Patent: Feb. 19, 2019

(54) CONDUCTIVE FILM COATED SUBSTRATE, MULTILAYER REFLECTIVE FILM COATED SUBSTRATE, REFLECTIVE MASK BLANK, REFLECTIVE MASK, AND SEMICONDUCTOR DEVICE MANUFACTURING METHOD

(71) Applicant: HOYA CORPORATION, Tokyo (JP)

(72) Inventors: Kazuhiro Hamamoto, Tokyo (JP); Yoichi Usui, Tokyo (JP)

(73) Assignee: HOYA CORPORATION, Shinjuku-ku, Tokyo (JP)

( * ) Notice: Subject to any disclaimer, the term of this patent is extended or adjusted under 35 U.S.C. 154(b) by 12 days.

(21) Appl. No.: 15/655,932

(22) Filed: Jul. 21, 2017

(65) Prior Publication Data

US 2017/0315439 A1    Nov. 2, 2017

Related U.S. Application Data

(62) Division of application No. 14/896,411, filed as application No. PCT/JP2014/074993 on Sep. 22, 2014, now Pat. No. 9,746,762.

(30) Foreign Application Priority Data

Sep. 27, 2013   (JP) ................................. 2013-202494

(51) Int. Cl.
| | |
|---|---|
| *B32B 7/02* | (2006.01) |
| *G03F 1/24* | (2012.01) |
| *G03F 1/38* | (2012.01) |
| *G03F 7/20* | (2006.01) |

(52) U.S. Cl.
CPC ............... *G03F 1/24* (2013.01); *B32B 7/02* (2013.01); *G03F 1/38* (2013.01); *G03F 7/20* (2013.01); *B32B 2307/416* (2013.01); *B32B 2551/00* (2013.01)

(58) Field of Classification Search
CPC ..... G03F 1/24; G03F 1/38; G03F 7/20; B32B 7/02; B32B 2307/416; B32B 2551/00
USPC ........................................................... 430/5
See application file for complete search history.

(56) References Cited

U.S. PATENT DOCUMENTS

| | | | |
|---|---|---|---|
| 5,549,954 | A | 8/1996 | Otsuka et al. |
| 2006/0194080 | A1 | 8/2006 | Ishii et al. |
| 2009/0253055 | A1 | 10/2009 | Hayashi et al. |
| 2011/0109994 | A1 | 5/2011 | Kitsunai et al. |
| 2013/0078554 | A1 | 3/2013 | Sakai et al. |
| 2013/0323630 | A1 | 12/2013 | Maeshige et al. |
| 2014/0329174 | A1 | 11/2014 | Hamamoto et al. |

FOREIGN PATENT DOCUMENTS

| | | |
|---|---|---|
| JP | 7-85463 A | 3/1995 |
| JP | 2002-288823 A | 10/2002 |
| JP | 2004-199846 A | 7/2004 |
| JP | 2007-272995 A | 10/2007 |
| JP | 2012-026831 A | 2/2012 |
| JP | 2012-028631 A | 2/2012 |
| JP | 4978626 B2 | 7/2012 |
| TW | 201327025 A | 7/2013 |
| TW | 201329612 A | 7/2013 |
| WO | 2010/001843 A1 | 1/2010 |
| WO | 2012/105698 A1 | 8/2012 |
| WO | 2013/146991 A1 | 10/2013 |

OTHER PUBLICATIONS

Taiwanese Search Report for TW103133627.
International Search Report for PCT/JP2014/074993 dated Jan. 6, 2015.
Communication dated Mar. 2, 2017 issued by the Korean Intellectual Property Office in counterpart application No. 10-2015-7035761.
M. Raposo et al. "A Guide for Atomic Force Microscopy Analysis of Soft-Condensed Matter", Modern Research and Educational Topics in Microscopy, pp. 758-769, 2007.

*Primary Examiner* — Christopher G Young
(74) *Attorney, Agent, or Firm* — Sughrue Mion, PLLC

(57) ABSTRACT

A conductive film coated substrate, including a conductive film formed thereon. In a relationship between a bearing area (%) and a bearing depth (nm) that are obtained by measuring, with an atomic force microscope, a region of 1 μm×1 μm of a surface of the conductive film, the surface of the conductive film satisfies a relationship that $(BA_{70}-BA_{30})/(BD_{70}-BD_{30})$ is 15 or more and 260 or less (%/nm), and a maximum height (Rmax) is 1.3 nm or more and 15 nm or less.

11 Claims, 5 Drawing Sheets

CONDUCTIVE FILM COATED SUBSTRATE, MULTILAYER REFLECTIVE FILM COATED SUBSTRATE, REFLECTIVE MASK BLANK, REFLECTIVE MASK, AND SEMICONDUCTOR DEVICE MANUFACTURING METHOD

CROSS REFERENCE TO RELATED APPLICATIONS

This is a Divisional of application Ser. No. 14/896,411 filed Dec. 7, 2015, claiming priority based on International Application No. PCT/JP2014/074993 filed Sep. 22, 2014, claiming priority based on Japanese Patent Application No. 2013-202494 filed Sep. 27, 2013, the contents of all of which are incorporated herein by reference in their entirety.

TECHNICAL FIELD

This invention relates to a conductive film coated substrate, a multilayer reflective film coated substrate, a reflective mask blank, and a reflective mask that are for use in EUV lithography, and to a semiconductor device manufacturing method using the same.

BACKGROUND ART

In recent years, in a semiconductor industry, as a semiconductor device becomes more integrated, a finer pattern over a transfer limit of related-art photolithography using ultraviolet light becomes necessary. EUV lithography, which is an exposure technology using extreme ultra violet (hereinafter referred to as "EUV") light, is promising for enabling formation of such a fine pattern. In this case, EUV light means light in a wavelength band of a soft X-ray region or a vacuum ultraviolet radiation region, and specifically, light at a wavelength of about 0.2 nm to about 100 nm. As a mask for transfer used in this EUV lithography, a reflective mask is proposed. Such a reflective mask is a mask in which a multilayer reflective film for reflecting exposure light is formed on a substrate and an absorber film for absorbing exposure light is formed on the multilayer reflective film in a pattern.

The reflective mask is manufactured by forming an absorber film pattern by photolithography or the like from a reflective mask blank including a substrate, a multilayer reflective film formed on the substrate, and an absorber film formed on the multilayer reflective film.

In general, the multilayer reflective film and the absorber layer are formed using a film forming method such as sputtering. In the film formation, the substrate for the reflective mask blank is supported in a film forming apparatus by support means. As the support means for the substrate, an electrostatic chuck is used. Therefore, in order to facilitate fixing of the substrate by the electrostatic chuck, a conductive film (back surface conductive film) is formed on a back surface of an insulating substrate for the reflective mask blank such as a glass substrate.

As an example of the conductive film coated substrate, in Patent Document 1, there is disclosed a conductive film coated substrate for use in manufacturing a reflective mask blank for EUV lithography, which has a feature in that the conductive film contains chromium (Cr) and nitrogen (N), an average concentration of N in the conductive film is 0.1 at % or more and less than 40 at %, a crystal state of at least a surface of the conductive film is amorphous, a surface roughness (rms) of the conductive film is 0.5 nm or less, and the conductive film is a composition gradient film in which the N concentration in the conductive film changes along a thickness direction of the conductive film so that the N concentration on the substrate side is low and the N concentration on the surface side is high.

Further, in Patent Document 2, there is disclosed a conductive film coated substrate for use in manufacturing a reflective mask blank for EUV lithography, the conductive film being formed on the substrate, which has a feature in that the conductive film includes at least two layers of a layer formed on the substrate side (lower layer) and a layer formed on the lower layer (upper layer), the lower layer of the conductive film contains chromium (Cr), oxygen (O), and hydrogen (H), and the upper layer of the conductive film contains chromium (Cr), nitrogen (N), and hydrogen (H). Further, in Patent Document 2, it is disclosed that a surface roughness (rms) of the conductive film is 0.5 nm or less.

PRIOR ART DOCUMENTS

Patent Documents

Patent Document 1: JP-B-4978626
Patent Document 2: WO 2012/105698 A1

SUMMARY OF THE INVENTION

Problem to be Solved by the Invention

As a pattern in lithography using EUV (Extreme Ultra-Violet) becomes rapidly finer, a defect size of an EUV mask that is a reflective mask becomes smaller year after year. In order to find such a fine defect, an inspection light source wavelength used in defect inspection is approaching a light source wavelength of exposure light.

For example, as a defect inspection apparatus for an EUV mask, a reflective mask blank serving as a master thereof, a multilayer reflective film coated substrate, and a substrate for a mask blank, highly sensitive defect inspection apparatus having an inspection light source wavelength of 266 nm (for example, an EUV exposure mask substrates/blanks defect inspection apparatus "MAGICS M7360" manufactured by Lasertec Corporation), 193 nm (EUV mask/blank defect inspection apparatus "Teron 600 series" manufactured by KLA-Tencor Corporation, for example, "Teron 610"), and 13.5 nm are widespread or proposed.

Incidentally, a fiducial mark can be formed on a substrate for a mask blank, a multilayer reflective film coated substrate, and a reflective mask blank (collectively referred to simply as "substrate and the like"), and positions of the fiducial mark and of a defect detected by the defect inspection apparatus can be controlled based on coordinates thereof. Based on positional information of the defect (defect data) obtained, drawing data for manufacture of the reflective mask is corrected so that an absorber pattern is formed at a location where the defect exists based on the defect data and transferred pattern (circuit pattern) data, thereby being able to reduce defects. Therefore, in order to reduce detects, it is important to accurately measure a position of a defect.

When an object to be inspected such as a reflective mask, a reflective mask blank, and a multilayer reflective film coated substrate is inspected for a defect by a defect inspection apparatus, it is a common practice to mount a conductive film formed on a back surface of the substrate and the like (back surface conductive film) of such an object to be inspected on a mount provided on a stage of the defect inspection apparatus and fix the object to be inspected to the stage. The inventors of this invention found that the fixing of the substrate and the like on the stage was not reliable, and that, due to slippage of the substrate and the like when the stage of the defect inspection apparatus was moved, positional accuracy of detecting a defect by the defect inspection apparatus was sometimes lowered.

Further, the inventors of this invention also found that, in addition to the case of the positional accuracy in defect detection, when coordinates of a fiducial mark formed on a reflective mask blank or a multilayer reflective film coated substrate were measured by a coordinate measuring machine, and when a desired transfer pattern was measured before or after the pattern was formed on a reflective mask, and other such cases, the fixing of the substrate and the like by a mount on which the back surface conductive film was mounted was not reliable and a problem of lowered positional accuracy arose due to slippage of the substrate and the like when a stage of the coordinate measuring machine was moved.

While the problem of lowered positional accuracy as described above arises, if the surface smoothness of the back surface conductive film is not satisfactory, an apparent defect (pseudo defect) may be a problem when the back surface conductive film is inspected for a defect by a defect inspection apparatus. Specifically, a problem arises that, due to high detection sensitivity of the defect inspection apparatus, when a back surface conductive film is inspected for a defect, the number of detected defects ((the number of detected defects)=(the number of critical defects)+(the number of pseudo defects)) becomes larger than an actual number, and, in some cases, defect inspection becomes impossible.

A pseudo defect as used herein means one which is erroneously determined to be a defect in inspection by a defect inspection apparatus, and is liable to occur when a surface to be inspected is rough.

Accordingly, an object of this invention is to provide a conductive film coated substrate, a multilayer reflective film coated substrate, a reflective mask blank, and a reflective mask with which, when the reflective mask, the reflective mask blank, and the multilayer reflective film coated substrate are inspected for a defect by a defect inspection apparatus, and, when coordinates of a fiducial mark formed on the reflective mask blank and the multilayer reflective film coated substrate and of a transfer pattern of the reflective mask are measured by a coordinate measuring machine or the like, the positional accuracy of a defect detected by the defect inspection apparatus and the positional accuracy of the fiducial mark, the positional accuracy of the transfer pattern by the coordinate measuring machine, and the like can be improved. Specifically, an object of this invention is to provide a reflective mask, a reflective mask blank, and a multilayer reflective film coated substrate which can, when the reflective mask, the reflective mask blank, and the multilayer reflective film coated substrate are inspected/measured by a defect inspection apparatus, a coordinate measuring machine, and the like, inhibit slippage of a back surface conductive film when the substrate and the like are fixed by a mount. Another object of this invention is to provide a reflective mask blank and a multilayer reflective film coated substrate which can, at that time, inhibit detection of a pseudo defect due to surface roughness of the back surface conductive film and facilitate finding of a critical defect such as a foreign matter or a flaw.

Means to Solve the Problem

As a result of diligent review for the purpose of solving the problem described above, the inventors of this invention found a correlation between lowered positional accuracy of a detected defect or lowered positional accuracy of a pattern (such as a fiducial mark or a transfer pattern) determined by measuring the coordinates, and the surface roughness of the back surface conductive film. The inventors of this invention further found that, when the surface of the back surface conductive film had a predetermined surface geometry, the positional accuracy of a defect detected by a defect inspection apparatus and the accuracy of measurement of the pattern by the coordinate measuring machine were enhanced, to thereby reach this invention. Specifically, the inventors of this invention found that, in order to enhance the positional accuracy of a defect detected by a defect inspection apparatus and the positional accuracy of a pattern determined by a coordinate measuring machine, it was necessary to inhibit slippage of the back surface conductive film when the substrate and the like were fixed by the mount. The inventors of this invention further found that, in order to inhibit the slippage of the back surface conductive film and to inhibit detection of a pseudo defect due to surface roughness of the back surface conductive film, it was necessary that the relationship between a bearing area (%) and a bearing depth (nm) obtained by measuring the surface of the back surface conductive film with an atomic force microscope be a predetermined relationship and a maximum height (Rmax) be in a predetermined range, to thereby reach this invention. Specifically, in order to solve the problem described above, this invention has the following structure.

This invention is a conductive film coated substrate having Structures 1 to 3 described below, a multilayer reflective film coated substrate having Structures 4 and 5, a reflective mask blank having Structure 6 described below, a reflective mask having Structure 7 described below, and a semiconductor device manufacturing method having Structure 8 described below.

(Structure 1)

According to Structure 1 of this invention, there is provided a conductive film coated substrate including a substrate for a mask blank for use in lithography; and a conductive film formed on one main surface of the substrate, wherein, in a relationship between a bearing area (%) and a bearing depth (nm) that are obtained by measuring, with an atomic force microscope, a region of 1 µm×1 µm of a surface of the conductive film, when a bearing area of 30% is defined as $BA_{30}$, a bearing area of 70% is defined as $BA_{70}$, and bearing depths corresponding to the bearing areas of 30% and 70% are defined as $BD_{30}$ and $BD_{70}$, respectively, the surface of the conductive film satisfies a relationship that $(BA_{70}-BA_{30})/(BD_{70}-BD_{30})$ is 15 or more and 260 or less (%/nm), and a maximum height (Rmax) is 1.3 nm or more and 15 nm or less.

According to Structure 1, the relationship between the bearing area (%) and the bearing depth (nm) that are obtained by measuring, with an atomic force microscope, a region of 1 µm×1 µm of the surface of the conductive film is the predetermined relationship, and the maximum height (Rmax) is in the predetermined range. Thus, when the conductive film coated substrate, and a multilayer reflective film coated substrate, a reflective mask blank, and a reflective mask that are manufactured using the same are inspected for a defect by a defect inspection apparatus, and, when coordinates of a fiducial mark formed on the reflective mask blank and the multilayer reflective film coated substrate and a transfer pattern of the reflective mask are measured by a coordinate measuring machine or the like, the positional accuracy of a defect detected by the defect inspection apparatus, the positional accuracy of the fiducial mark and the positional accuracy of the transfer pattern determined by the coordinate measuring machine, and the like may be improved. Specifically, according to Structure 1, when the conductive film coated substrate, and the multilayer reflective film coated substrate, the reflective mask blank, and the reflective mask that are manufactured using the same are inspected and measured by a defect inspection apparatus, a coordinate measuring machine, and the like, slippage of the back surface conductive film when the substrate and the like are fixed by the mount may be inhibited. Further, detection of a pseudo defect due to surface roughness of the back surface conductive film may be inhibited to facilitate finding of a critical defect such as a foreign matter or a flaw.

(Structure 2)

According to Structure 2 of this invention, there is provided a conductive film coated substrate described in Structure 1, wherein, in a frequency distribution chart where a relationship between the bearing depth obtained by measuring with the atomic force microscope and a frequency (%) of the obtained bearing depth of the surface of the conductive film is plotted, an absolute value of a bearing depth corresponding to a center of a full width at half maximum, which is determined from an approximated curve drawn through the plotted points or a highest frequency of the plotted points, is smaller than an absolute value of a bearing depth corresponding to ½ of the maximum height (Rmax) of surface roughness of the surface of the conductive film.

According to Structure 2, in the frequency distribution chart in which the relationship between the predetermined bearing depth and the frequency (%) of the predetermined bearing depth of the surface of the conductive film is plotted, the bearing depth has the predetermined relationship. Thus, unevenness forming the surface of the back surface conductive film has a surface geometry in which a ratio of depressed portions with respect to a reference level is larger than a ratio of projecting portions with respect to the reference level. Therefore, according to Structure 2, a problem of dust generation due to existence of the projecting portions on the surface of the back surface conductive film may be prevented.

(Structure 3)

According to Structure 3 of this invention, there is provided a conductive film coated substrate described in Structure 1, wherein, in a frequency distribution chart where a relationship between the bearing depth obtained by measuring with the atomic force microscope and a frequency (%) of the obtained bearing depth of the surface of the conductive film is plotted, an absolute value of a bearing depth corresponding to a center of a full width at half maximum, which is determined from an approximated curve drawn through the plotted points or a highest frequency of the plotted points, is equal to or larger than an absolute value of a bearing depth corresponding to ½ of the maximum height (Rmax) of surface roughness of the surface of the conductive film.

According to Structure 3, in the frequency distribution chart in which the relationship between the predetermined bearing depth and the frequency (%) of the predetermined bearing depth of the surface of the conductive film is plotted, the bearing depth has the predetermined relationship. Thus, unevenness forming the surface of the back surface conductive film has a surface geometry in which a ratio of projecting portions with respect to a reference level is larger than a ratio of depressed portions with respect to the reference level. Therefore, according to Structure 3, a foreign matter adhering to the back surface conductive film when a defect of a reflective mask blank and of a multilayer reflective film coated substrate is inspected and measured by a defect inspection apparatus, a coordinate measuring machine, and the like, and when a back surface of a reflective mask is electrostatically chucked and a semiconductor device is manufactured by an exposure apparatus may be effectively removed by a cleaning process.

(Structure 4)

According to Structure 4 of this invention, there is provided a multilayer reflective film coated substrate including a multilayer reflective film formed by alternately laminating a high refractive index layer and a low refractive index layer, wherein the multilayer reflective film is formed on a main surface of the conductive film coated substrate described in Structures 1 to 3 on a side opposite to a side on which the conductive film is formed.

According to Structure 4, EUV light at a predetermined wavelength may be reflected by the predetermined multilayer reflective film. Further, when the substrate provided with a multilayer reflective film according to Structure 3 is inspected and measured by a defect inspection apparatus, a coordinate measuring machine, and the like, slippage of the back surface conductive film when the substrate and the like are fixed by the mount may be inhibited.

(Structure 5)

According to Structure 5, there is provided a multilayer reflective film coated substrate described in Structure 4, further including a protective film formed on the multilayer reflective film.

According to Structure 5, the protective film is formed on the multilayer reflective film. Thus, damage to a surface of the multilayer reflective film when the multilayer reflective film coated substrate is used to manufacture a reflective mask (EUV mask) may be inhibited. Therefore, reflectivity characteristics to EUV light become satisfactory.

(Structure 6)

According to Structure 6 of this invention, there is provided a reflective mask blank including an absorber film formed on the multilayer reflective film or on the protective film of the multilayer reflective film coated substrate described in Structure 4 or 5.

According to Structure 6, the absorber film of the reflective mask blank may absorb EUV light. Thus, a reflective mask (EUV mask) may be manufactured by patterning the absorber film of the reflective mask blank. Further, according to Structure 6, when the reflective mask blank is inspected and measured by a defect inspection apparatus, a coordinate measuring machine, and the like, slippage of the back surface conductive film when the substrate and the like are fixed by the mount may be inhibited.

(Structure 7)

According to Structure 7, there is provided a reflective mask including an absorber pattern provided on the multilayer reflective film, wherein the absorber pattern is formed by patterning the absorber film of the reflective mask blank described in Structure 6.

According to the reflective mask of Structure 7, the multilayer reflective film has the absorber pattern formed thereon. Thus, a predetermined pattern may be transferred using EUV light to a transfer target. Further, according to Structure 7, when the reflective mask is inspected and measured by a defect inspection apparatus, a coordinate measuring machine, and the like, slippage of the back surface conductive film when the substrate and the like are fixed by the mount may be inhibited.

(Structure 8)

According to Structure 8 of this invention, there is provided a method of manufacturing a semiconductor device, including a step of performing a lithography process with the reflective mask described in Structure 7 using an exposure apparatus to form a transfer pattern on a transfer target.

According to the semiconductor device manufacturing method of Structure 8, a semiconductor device having a fine and highly accurate transfer pattern may be manufactured.

Effect of the Invention

According to the embodiments of this invention, the conductive film coated substrate, the multilayer reflective film coated substrate, the reflective mask blank, and the reflective mask may be provided, with which, when the reflective mask, the reflective mask blank, and the multilayer reflective film coated substrate are inspected for a defect by a defect inspection apparatus, and, when a fiducial mark formed on the reflective mask blank and the multilayer reflective film coated substrate and a transfer pattern of the reflective mask are measured by a coordinate measuring machine or the like, the positional accuracy of a defect detected by the defect inspection apparatus and the positional accuracy of the fiducial mark and a pattern such as the transfer pattern by the coordinate measuring machine may be improved. Specifically, according to the embodiments of this invention, the reflective mask, the reflective mask blank, and the multilayer reflective film coated substrate may be provided, which may, when the reflective mask, the reflective mask blank, and the multilayer reflective film coated substrate are inspected/measured by a defect inspection apparatus, a coordinate measuring machine, and the like, inhibit slippage of the back surface conductive film when the substrate and the like are fixed by a mount. Further, according to the embodiments of this invention, the reflective mask blank and the multilayer reflective film coated substrate may be provided, which may, at that time, inhibit detection of a pseudo defect due to surface roughness of the back surface conductive film and facilitate finding of a critical defect such as a foreign matter or a flaw.

MODES FOR EMBODYING THE INVENTION

This invention is a conductive film coated substrate in which the conductive film is formed on one surface of main surfaces of a substrate for a mask blank. A main surface of the main surfaces of the substrate for a mask blank on which the conductive film (also referred to as "back surface conductive film") is formed is referred to as a "back surface". This invention is also a multilayer reflective film coated substrate in which a multilayer reflective film having a high refractive index layer and a low refractive index layer alternately laminated is formed on a main surface (sometimes simply referred to as "surface") of the conductive film coated substrate having no conductive film formed thereon. This invention is also a reflective mask blank having a multilayer firm for a mask blank in which an absorber film is included on a multilayer reflective film of a multilayer reflective film coated substrate.

Figure 2:
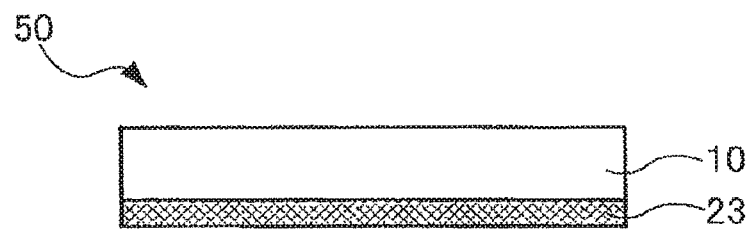
FIG. 2 is a schematic sectional view for illustrating an exemplary structure of a conductive film coated substrate according to an embodiment of this invention.

FIG. 2 is a schematic view for illustrating an exemplary substrate 50 provided with a conductive film according to this invention. In the substrate 50 provided with a conductive film according to this invention, a back surface conductive film 23 is formed on a back surface of a substrate 10 for a mask blank. Note that, in this specification, the substrate 50 provided with a conductive film is a substrate in which at least the back surface conductive film 23 is formed on the back surface of the substrate 10 for a mask blank. A substrate in which a multilayer reflective film 21 is formed on another main surface (substrate 20 provided with a multilayer reflective film), a substrate in which an absorber film 24 is further formed (reflective mask blank 30), and the like are also included in the substrate 50 provided with a conductive film.

Figure 7:
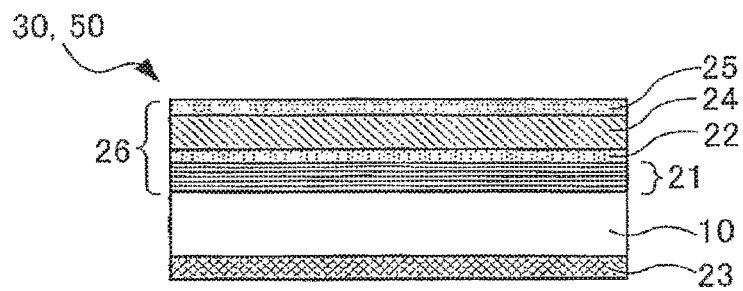
FIG. 7 is a schematic sectional view for illustrating another exemplary structure of the reflective mask blank according to the embodiment of this invention.

FIG. 7 is a schematic view for illustrating an exemplary reflective mask blank 30 according to this invention. The reflective mask blank 30 according to this invention includes a multilayer firm 26 for a mask blank on a main surface of the substrate 10 for a mask blank. In this specification, the multilayer firm 26 for a mask blank is a plurality of films including the multilayer reflective film 21 and the absorber film 24 laminated and formed on the main surface of the substrate 10 for a mask blank of the reflective mask blank 30. The multilayer firm 26 for a mask blank can further include a protective film 22 formed between the multilayer reflective film 21 and the absorber film 24, and/or an etching mask film 25 formed on a surface of the absorber film 24. In the case of the reflective mask blank 30 illustrated in FIG. 7, the multilayer firm 26 for a mask blank formed on the main surface of the substrate 10 for a mask blank has the multilayer reflective film 21, the protective film 22, the absorber film 24, and the etching mask film 25. Note that, when the reflective mask blank 30 having the etching mask film 25 is used, as described later, the etching mask film 25 may be separated after a transfer pattern is formed in the absorber film 24. Further, in the reflective mask blank 30 that does not have the etching mask film 25 formed therein, the absorber film 24 may have a structure in which a plurality of layers are laminated and materials forming the plurality of layers may be materials having etching characteristics different from one another so that the reflective mask blank 30 may include the absorber film 24 having the function of an etching mask. Further, a back surface of the reflective mask blank 30 of this invention includes the back surface conductive film 23. Therefore, the reflective mask blank 30 illustrated in FIG. 7 is a kind of the substrate 50 provided with a conductive film.

In this specification, "including a multilayer firm 26 for a mask blank on a main surface of the substrate 10 for a mask blank" includes, in addition to a case in which the multilayer firm 26 for a mask blank is arranged in contact with the surface of the substrate 10 for a mask blank, a case in which another film is formed between the substrate 10 for a mask blank and the multilayer firm 26 for a mask blank. The same can be said for other films. Further, in this specification, for example, "a film A is arranged in contact with a surface of a film B" means that the film A and the film B are arranged directly in contact with each other without another film intervening between the film A and the film B.

Figure 5:
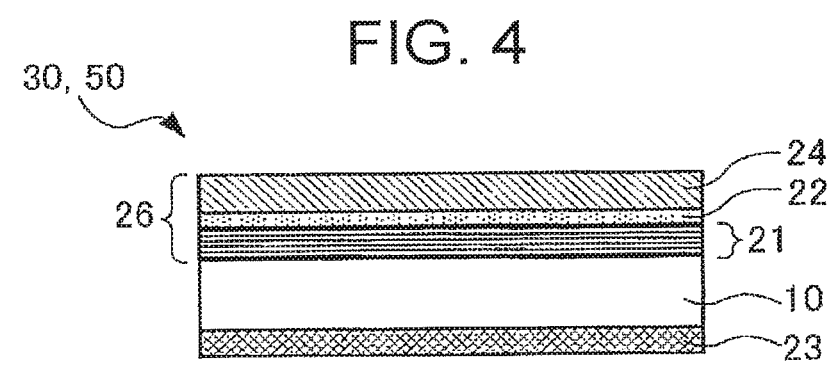
FIG. 5 is a schematic sectional view for illustrating an exemplary structure of a reflective mask blank according to an embodiment of this invention.

FIG. 5 is a schematic view for illustrating another exemplary reflective mask blank 30 according to this invention. In the case of the reflective mask blank 30 illustrated in FIG. 5, the multilayer firm 26 for a mask blank has the multilayer reflective film 21, the protective film 22, and the absorber film 24, but does not have the etching mask film 25. Further, the reflective mask blank 30 illustrated in FIG. 5 includes the back surface conductive film 23 on the back surface thereof. Therefore, the reflective mask blank 30 illustrated in FIG. 5 is a kind of the substrate 50 provided with a conductive film.

Figure 3:
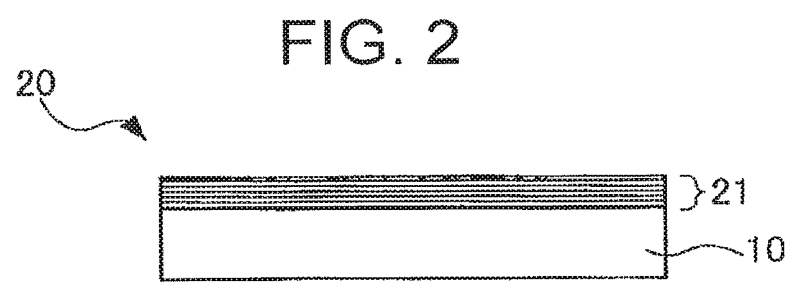
FIG. 3 is a schematic sectional view for illustrating an exemplary structure of a multilayer reflective film coated substrate according to an embodiment of this invention.
Figure 4:
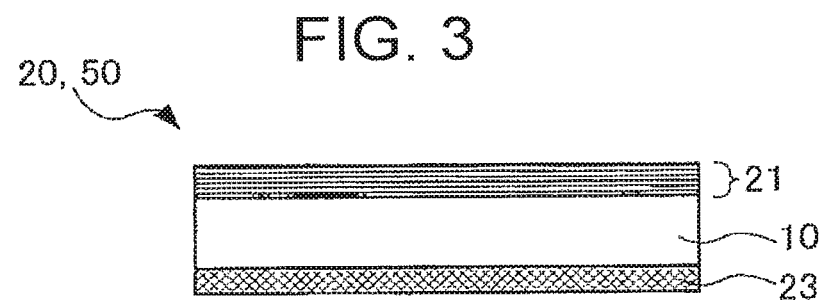
FIG. 4 is a schematic sectional view for illustrating an exemplary structure of a multilayer reflective film coated substrate according to an embodiment of this invention.

FIG. 3 is an illustration of the substrate 20 provided with a multilayer reflective film. The multilayer reflective film 21 is formed on a main surface of the substrate 20 provided with a multilayer reflective film illustrated in FIG. 3. FIG. 4 is an illustration of the substrate 20 provided with a multilayer reflective film having the back surface conductive film 23 formed on a back surface thereof. The substrate 20 provided with a multilayer reflective film illustrated in FIG. 4 includes the back surface conductive film 23 on the back surface thereof, and thus, is a kind of the substrate 50 provided with a conductive film.

The substrate 50 provided with a conductive film according to this invention has a feature in that a relationship between a bearing area (%) and a bearing depth (nm) that are obtained by measuring, with an atomic force microscope, a region of 1 μm×1 μm of a surface of the back surface conductive film 23 is a predetermined relationship and a maximum height (Rmax) of surface roughness is in a predetermined range.

According to the substrate 50 provided with a conductive film of this invention, when a defect of a reflective mask 40, the reflective mask blank 30, and the substrate 20 provided with a multilayer reflective film are inspected and measured by a defect inspection apparatus, a coordinate measuring machine, and the like, the positional accuracy of a defect detected by the defect inspection apparatus and the positional accuracy of a fiducial mark or a pattern such as a transfer pattern determined by the coordinate measuring machine can be improved. At that time, detection of a pseudo defect due to surface roughness of the back surface conductive film 23 can be inhibited to facilitate finding of a critical defect such as a foreign matter or a flaw.

Next, a relationship between the surface roughness (Rmax, Rms) as a parameter showing a surface geometry of the back surface conductive film 23 and a bearing curve (bearing area (%) and bearing depth (nm)) is described below.

First, root means square (Rms), which is a typical index of the surface roughness, is a root means square roughness, and is a square root of a mean value of squares of deviations from an average line to a measurement curve. Rms is represented by the following Expression (1):

[Math. 1]

$$\text{Rms} = \sqrt{\frac{1}{l}\int_0^l Z^2(x)dx} \quad (1)$$

In Expression (1), l is a reference length and Z is a height from the average line to the measurement curve.

Rmax, which is a typical index of the surface roughness as well, is the maximum height of the surface roughness, and is an absolute difference between a maximum value of a height of a peak and a maximum value of a depth of a valley of a roughness curve.

Rms and Rmax are hitherto used for controlling a surface roughness of the substrate 10 for a mask blank, and are excellent in that the surface roughness can be numerically grasped. However, both of Rms and Rmax are information on height, and do not include information on minute change in surface geometry.

On the other hand, the bearing curve is formed by plotting ratios of an area of a section of unevenness in a measurement region on the main surface of the substrate 10 that is cut by an arbitrary contour plane (level) to an area of the measurement region. The bearing curve enables visualization and conversion into a numerical form of variations of the surface roughness of the back surface conductive film 23.

The bearing curve is generally plotted under a state in which the vertical axis represents the bearing area (%) and the horizontal axis represents the bearing depth (nm). A bearing area of 0(%) represents a highest point of a surface of a substrate measured, and a bearing area of 100(%) represents a lowest point of the surface of the substrate measured. Therefore, a difference between the depth of the bearing area of 0(%) and the depth of the bearing area of 100(%) is the maximum height (Rmax) of the surface roughness described above. Note that, "bearing depth" as referred to in this invention is equivalent to "bearing height". In the case of "bearing height", opposite to the above description, the bearing area of 0(%) represents the lowest point of the surface of the substrate measured, and the bearing area of 100(%) represents the highest point of the surface of the substrate measured. Control of the bearing curve in the back surface conductive film 23 according to this embodiment is described below.

In the substrate 50 provided with a conductive film according to this invention, in the relationship between the bearing area (%) and the bearing depth (nm) that are obtained by measuring, with an atomic force microscope, a region of 1 μm×1 μm of the surface of the back surface conductive film 23, when a bearing area of 30% is defined as $BA_{30}$, a bearing area of 70% is defined as $BA_{70}$, and bearing depths corresponding to the bearing areas of 30% and 70% are defined as $BD_{30}$ and $BD_{70}$, respectively, the surface of the conductive film satisfies a relationship that $(BA_{70}-BA_{30})/(BD_{70}-BD_{30})$ is 15 or more and 260 or less (%/nm) and the maximum height (Rmax) is 1.3 nm or more and 15 nm or less.

Specifically, $(BA_{70}-BA_{30})/(BD_{70}-BD_{30})$ (unit: %/nm) described above represents a slope of the bearing curve when the bearing area is from 30% to 70%. By setting the slope to be 15(%/nm) or more, the bearing area reaches 100% with a smaller bearing depth (nm). In other words, the unevenness (surface roughness) of the surface of the reflective mask blank 30 maintains a very high level of smoothness and its surface geometry is uniform to a large extent. Thus, variations of the unevenness (surface roughness) as a cause of detecting a pseudo defect in defect inspection can be reduced, and thus, detection of a pseudo defect in defect inspection using a defect inspection apparatus can be inhibited, and further, a critical defect can be clarified.

Further, by setting the slope of the bearing curve to be 260 or less (%/nm), when the reflective mask 40, the reflective mask blank 30, and the substrate 20 provided with a multilayer reflective film are inspected and measured by a defect inspection apparatus, a coordinate measuring machine, and the like, slippage of the back surface conductive film 23 when the substrate and the like are fixed by a mount can be inhibited. Therefore, when the reflective mask 40, the reflective mask blank 30, and the substrate 20 provided with a multilayer reflective film are inspected for a defect by a defect inspection apparatus, and, when a fiducial mark formed on the reflective mask 40, the reflective mask blank 30, and the substrate 20 provided with a multilayer reflective film and a transfer pattern of the reflective mask are measured by a coordinate measuring machine or the like, the positional accuracy of a defect detected by the defect inspection apparatus and the positional accuracy of the fiducial mark or a pattern such as the transfer pattern determined by the coordinate measuring machine can be improved.

According to this invention, the region of 1 μm×1 μm may be in an arbitrary location in a region including, in manufacturing a semiconductor device using an exposure apparatus, a region in which the back surface of the reflective mask (back surface conductive film 23) abuts an electrostatic chuck and a region in which the back surface of the reflective mask (back surface conductive film 23) abuts the mount of the defect inspection apparatus or the coordinate measuring machine. The above-mentioned region including the region in which the electrostatic chuck abuts the back surface conductive film 23 and the region in which the mount of the defect inspection apparatus or the coordinate measuring machine abuts can be, when the substrate 10 for a mask blank is in a 6025 size (152 mm×152 mm×6.35 mm), for example, a region of 148 mm×148 mm, a region of 146 mm×146 mm, a region of 142 mm×142 mm, or a region of 132 mm×132 mm excluding a peripheral region on the surface of the reflective mask blank 30. Further, the arbitrary location can be, for example, a region at the center of the back surface of the substrate 50 provided with a conductive film on which the back surface conductive film 23 is formed and/or a region in which the mount of the defect inspection apparatus or the coordinate measuring machine abuts the back surface conductive film 23 (abutting portion and a vicinity thereof).

Further, according to this invention, the region of 1 μm×1 μm can be a region at the center of the back surface of the substrate 50 provided with a conductive film on which the back surface conductive film 23 is formed and a region in which the defect inspection apparatus or the coordinate measuring machine abuts the back surface conductive film 23. For example, when the film surface of the back surface conductive film 23 is in a rectangular shape, the center is a point of intersection of diagonal lines of the rectangle. Specifically, the point of intersection and the center of the region (the center of the region is the same as the center of the surface of the back surface conductive film 23) are spatially coincident with each other.

From the viewpoint of inhibiting detection of a pseudo defect, it is preferred that the surface of the back surface conductive film 23 of the substrate 50 provided with a conductive film have a surface geometry in which unevenness (surface roughness) forming the main surface is uniform. Therefore, $(BA_{70}-BA_{30})/(BD_{70}-BD_{30})$ of the surface of the back surface conductive film 23 is set to be 15(%/nm) or more. $(BA_{70}-BA_{30})/(BD_{70}-BD_{30})$ of the surface of the back surface conductive film 23 be preferably 20(%/nm) or more, more preferably 30(%/nm) or more, still preferably 40(%/nm) or more, and further preferably 50(%/nm) or more. From a similar viewpoint, the maximum height (Rmax) of the surface roughness of the surface of the back surface conductive film 23 is set to be 15 nm or less. The maximum height (Rmax) of the surface roughness of the surface of the back surface conductive film 23 be preferably 10 nm or less, more preferably 9 nm or less, and still preferably 8.5 nm or less.

Further, from the viewpoint of inhibiting slippage of the back surface conductive film 23 when the substrate and the like are fixed by the mount, it is preferred that the surface of the back surface conductive film 23 of the substrate 50 provided with a conductive film have a surface geometry in which unevenness (surface roughness) forming the main surface is not completely uniform. Therefore, $(BA_{70}-BA_{30})/(BD_{70}-BD_{30})$ of the surface of the back surface conductive film 23 is set to be 260(%/nm) or less. $(BA_{70}-BA_{30})/(BD_{70}-BD_{30})$ of the surface of the back surface conductive film 23 be preferably 230(%/nm) or less, and more preferably 200 (%/nm) or less. From a similar viewpoint, the maximum height (Rmax) of the surface roughness of the surface of the back surface conductive film 23 be 1.3 nm or more, preferably 1.4 nm or more, and more preferably 1.5 nm or more.

From the above, with regard to the surface of the back surface conductive film 23 of the substrate 50 provided with a conductive film, preferably, in the relationship between the bearing area (%) and the bearing depth (nm) that are obtained by measuring, with an atomic force microscope, a region of 1 μm×1 μm of the surface of the conductive film, when the bearing area of 30% is defined as $BA_{30}$, the bearing area of 70% is defined as $BA_{70}$, and the bearing depths corresponding to the bearing areas of 30% and 70% are defined as $BD_{30}$ and $BD_{70}$, respectively, the surface of the conductive film satisfies the relationship that $(BA_{70}-BA_{30})/(BD_{70}-BD_{30})$ is 15 or more and 260 or less (%/nm), preferably 20 or more and 260 or less (%/nm), and the maximum height (Rmax) is 1.3 nm or more and 15 nm or less, preferably 1.3 nm or more and 10 nm or less.

Further, the surface roughness of the surface of the back surface conductive film 23 can be controlled through, in addition to the maximum height (Rmax) described above, the root means square roughness (Rms). It is preferred that the root means square roughness (Rms) obtained by measuring, with an atomic force microscope, a region of 1 μm×1 μm of the surface of the back surface conductive film 23 be 0.15 nm or more and 1.0 nm or less.

Further, it is preferred that the surface of the back surface conductive film 23 have a surface geometry in which, in a frequency distribution chart where the relationship between the bearing depth obtained by measurement with an atomic force microscope and the frequency (%) of the obtained bearing depth is plotted, an absolute value of the bearing depth corresponding to a center of a full width at half maximum determined from an approximated curve drawn through the plotted points or a highest frequency of the plotted points is smaller than an absolute value of the bearing depth corresponding to ½ (half) of the maximum height (Rmax) of the surface roughness of the surface of the back surface conductive film 23. Unevenness forming the surface of the back surface conductive film 23 is a surface geometry in which a ratio of depressed portions with respect to a reference level is larger than a ratio of projecting portions with respect to the reference level. Therefore, a problem of dust generation due to existence of the projecting portions on the surface of the back surface conductive film 23 can be prevented.

Further, from the viewpoint of more effectively removing a foreign matter adhering to the back surface conductive film by a cleaning process, it is preferred that the surface of the back surface conductive film 23 have a surface geometry in which, in a frequency distribution chart where the relationship between the bearing depth obtained by measurement with an atomic force microscope and the frequency (%) of the obtained bearing depth is plotted, the absolute value of the bearing depth corresponding to the center of the full width at half maximum determined from the approximated curve drawn through the plotted points or the highest frequency of the plotted points is equal to or larger than the absolute value of the bearing depth corresponding to ½ (half) of the maximum height (Rmax) of the surface roughness of the surface of the back surface conductive film 23. Unevenness forming the surface of the back surface conductive film 23 is a surface geometry in which the ratio of the projecting portions with respect to the reference level is larger than the ratio of the depressed portions with respect to the reference level. Therefore, an effect can be obtained that when a defect of the reflective mask blank and of the multilayer reflective film coated substrate is inspected and measured by a defect inspection apparatus, a coordinate measuring machine, and the like, and when the back surface of the reflective mask is electrostatically chucked and a semiconductor device is manufactured by an exposure apparatus, a foreign matter adhering to the back surface conductive film can be effectively removed by the cleaning process.

Next, a power spectrum density (PSD) representing the surface geometry of the surface of the back surface conductive film 23 is described below.

As described above, Rms and Rmax are hitherto used for controlling the surface roughness of the substrate 10 for a mask blank, and are excellent in that the surface roughness can be numerically grasped. However, both of Rms and Rmax are information on height, and do not include information on minute change in surface shape.

On the other hand, power spectrum analysis that represents the obtained unevenness of the surface as amplitude intensity in spatial frequency by transformation into a spatial frequency region can convert minute surface shape into a numerical form. When data of height in an x coordinate and a y coordinate is represented by Z (x, y), Fourier transform thereof is given by Expression (2) below:

[Math. 2]

$$F(u, v) = \frac{1}{N_x N_y} \sum_{u=0}^{N_x-1} \sum_{v=0}^{N_y-1} Z(x, y)\exp\left[-i2\pi\left(\frac{ux}{N_x} + \frac{vy}{N_y}\right)\right] \quad (2)$$

Here, Nx and Ny are the numbers of data in an x direction and a y direction, respectively. u=0, 1, 2 . . . Nx-1 and v=0, 1, 2 . . . Ny-1 are established. A spatial frequency f at this time is given by Expression (3) below:

[Math. 3]

$$f = \left\{\left[\frac{u}{(N_x-1)d_x}\right]^2 + \left[\frac{v}{(N_y-1)d_y}\right]^2\right\}^{1/2} \quad (3)$$

Here, in Expression (3), dx is a minimum resolution in the x direction and dy is a minimum resolution in the y direction.

The power spectrum density PSD at this time is given by Expression (4) below:

[Math. 4]

$$P(u, v)=|F(u, v)|^2 \quad (4)$$

This power spectrum analysis is excellent in that change in surface geometry of the back surface conductive film 23 can be grasped not only as simple change in height but also as change thereof in the spatial frequency, and is a method of analyzing how a microscopic reaction on an atomic level and the like affects the surface.

In the substrate 50 provided with a conductive film according to this invention, in order to attain the objects described above, it is preferred that the surface of the back surface conductive film 23 have a power spectrum density of 30 nm$^4$ or more and 200 nm$^4$ or less in a spatial frequency of 1 μm$^{-1}$ or more and 100 μm$^{-1}$ or less obtained by measuring a region of 1 μm×1 μm with an atomic force microscope.

The region of 1 μm×1 μm may be in a location in a region including, in manufacturing a semiconductor device using an exposure apparatus, a region in which the back surface of the reflective mask (back surface conductive film 23) abuts an electrostatic chuck and a region in which the back surface of the reflective mask (back surface conductive film 23) abuts the mount of the defect inspection apparatus or the coordinate measuring machine. The above-mentioned region including the region in which the electrostatic chuck abuts the back surface conductive film 23 and the region in which the mount of the defect inspection apparatus or the coordinate measuring machine abuts can be, when the substrate 10 for a mask blank is in a 6025 size (152 mm×152 mm×6.35 mm), for example, a region of 148 mm×148 mm, a region of 146 mm×146 mm, a region of 142 mm×142 mm, or a region of 132 mm×132 mm excluding a peripheral region on the surface of the reflective mask blank 30. Further, the above-mentioned arbitrary location may be, for example, a region at the center of the back surface of the substrate 50 provided with a conductive film on which the back surface conductive film 23 is formed and/or a region in which the mount of the defect inspection apparatus or the coordinate measuring machine abuts the back surface conductive film 23 (abutting portion and a vicinity thereof).

Further, according to this invention, the region of 1 μm×1 μm can be a region at the center of the surface of the back surface conductive film 23 of the substrate 50 provided with a conductive film and/or a region in which the defect inspection apparatus or the coordinate measuring machine abuts the back surface conductive film 23. For example, when the surface of the back surface conductive film 23 of the substrate 50 provided with a conductive film is in a rectangular shape, the center is a point of intersection of diagonal lines of the rectangle. Specifically, the point of intersection and the center of the region (the center of the region is the same as the center of the surface of the film) are spatially coincident with each other.

Next, the substrate 50 provided with a conductive film according to this invention is specifically described.

[Substrate 10 for Mask Blank]

First, the substrate 10 for a mask blank that can be used in manufacturing the back surface conductive film 23 according to this invention is described below.

Figure 1A:
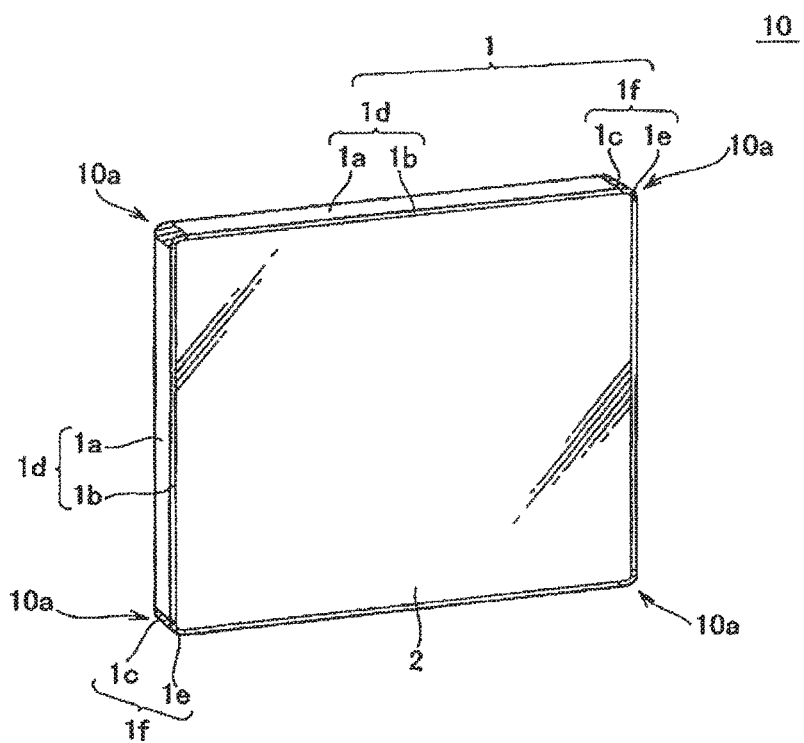
FIG. 1(a) shows a perspective view for illustrating a substrate for a mask blank according to an embodiment of this invention.
Figure 1B:
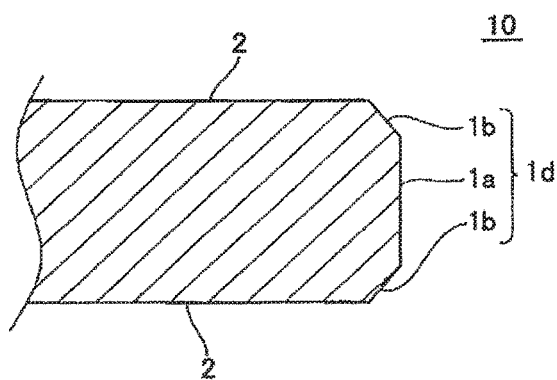
FIG. 1(b) shows a schematic sectional view for illustrating the substrate for a mask blank according to this embodiment.

FIG. 1(a) is a perspective view for illustrating an exemplary substrate 10 for a mask blank that can be used in manufacturing the back surface conductive film 23 according to this invention. FIG. 1(b) is a schematic sectional view of the substrate 10 for a mask blank illustrated in FIG. 1(a).

The substrate 10 for a mask blank (or, sometimes simply referred to as substrate 10) is a plate-like body in a rectangular shape, and has two opposed main surfaces 2 and end faces 1. The two opposed main surfaces 2 are an upper surface and a lower surface of the plate-like body, and are formed so as to be opposed to each other. Further, at least one of the two opposed main surfaces 2 is the main surface on which the transfer pattern is to be formed.

An end face 1 is a side surface of the plate-like body, and is adjacent to edges of the opposed main surfaces 2. The end face 1 has a planar end face portion 1d and a curved end face portion 1f. The planar end face portion 1d is a surface that connects a side of one opposed main surface 2 and a side of another opposed main surface 2, and includes a side surface portion 1a and beveled portions 1b. The side surface portion 1a is a portion approximately perpendicular to the opposed main surfaces 2 of the planar end face portion 1d (T plane). The beveled portion 1b is a beveled portion between the side surface portion 1a and the opposed main surface 2 (C plane), and is formed between the side surface portion 1a and the opposed main surface 2.

The curved end face portion 1f is a portion adjacent to a vicinity of a corner portion 10a of the substrate 10 when the substrate 10 is seen in plan view (R portion), and includes a side surface portion 1c and beveled portions 1e. Here, to see the substrate 10 in plan view is to see the substrate 10 from, for example, a direction perpendicular to the opposed main surfaces 2. Further, the corner portion 10a of the substrate 10 is, for example, a vicinity of an intersection of two sides at edges of the opposed main surfaces 2. An intersection of two sides may be an intersection of extensions of the two sides. In this example, the curved end face portion 1f is formed so as to be curved by rounding the corner portion 10a of the substrate 10.

Further, it is preferred that the main surfaces of the substrate 10 for a mask blank be surfaces to which surface treatment is applied by catalyst-referred etching. Catalyst-referred etching (hereinafter also referred to as CARE) is a surface treatment method in which an object to be treated (substrate 10 for a mask blank) and a catalyst are placed in a treatment liquid or the treatment liquid is supplied between the object to be treated and the catalyst, the object to be treated and the catalyst are brought into contact with each other, and the object to be treated is treated by an active species generated from a molecule in the treatment liquid adsorbed on the catalyst at that time. Note that, when the object to be treated is formed of a solid oxide such as glass, the treatment liquid is water, the object to be treated and the catalyst are brought into contact with each other in the presence of water, and the catalyst and a surface of the object to be treated are relatively moved or the like, thereby removing a product of hydrolytic degradation from the surface of the object to be treated to apply the treatment.

Surface treatment is selectively applied to the main surfaces of the substrate 10 for a mask blank by catalyst-referred etching from the projecting portions in contact with a surface of the catalyst as the reference level. Therefore, the unevenness (surface roughness) forming the main surfaces maintains a very high level of smoothness and its surface geometry is uniform to a large extent. In addition, in the surface geometry, the ratio of the depressed portions with respect to the reference level is larger than the ratio of the projecting portions with respect to the reference level. Therefore, when a plurality of thin films are laminated on the main surface, a defect size on the main surface tends to be small, and thus, from the viewpoint of defect quality, surface treatment by catalyst-referred etching is preferred. In particular, the effect is especially exerted when the multilayer reflective film 21 and the back surface conductive film 23 described below are formed on the main surface.

Note that, when a material of the substrate 10 is a glass material, as the catalyst, at least one material selected from the group consisting of platinum, gold, transition metals, and alloys including at least one thereof can be used. Further, as the treatment liquid, at least one treatment liquid selected from the group consisting of functional waters such as pure water, ozone water, and hydrogen water, a low-concentration alkaline aqueous solution, and a low-concentration acidic aqueous solution can be used.

It is preferred that, in the substrate 10 for a mask blank used for the back surface conductive film 23 according to this invention, the main surface on the side on which the transfer pattern is to be formed be surface treated so as to be highly flat from the viewpoint of obtaining at least pattern transfer accuracy and positional accuracy. In the case of the substrate 10 for an EUV reflective mask blank, in a region of 132 mm×132 mm or in a region of 142 mm×142 mm of the main surface of the substrate 10 on the side on which the transfer pattern is to be formed, the flatness is preferably 0.1 µm or less, and particularly preferably 0.05 µm or less. More preferably, in a region of 132 mm×132 mm of the main surface of the substrate 10 on the side on which the transfer pattern is to be formed, the flatness is 0.03 µm or less. Further, the main surface on the side opposite to the side on which the transfer pattern is to be formed is the surface that is electrostatically chucked when setting on an exposure apparatus is carried out, and, in a region of 142 mm×142 mm thereof, the flatness is 1 µm or less, and, particularly preferably, 0.5 µm or less.

A material of the substrate 10 for a reflective mask blank for EUV exposure may be anything having low thermal expansion characteristics. For example, so-called multicomponent-based glass having low thermal expansion characteristics such as $SiO_2$—$TiO_2$-based glass (binary ($SiO_2$—$TiO_2$) and ternary (such as $SiO_2$—$TiO_2$—$SnO_2$)), for example, $SiO_2$—$Al_2O_3$—$Li_2O$-based crystallized glass, can be used. Further, the substrate 10 formed of, other than the glasses described above, silicon, a metal, or the like can also be used. An Invar alloy (Fe—Ni based alloy) is an example of the metal substrate 10.

As described above, in the case of the substrate 10 for a mask blank for EUV exposure, the substrate 10 is required to have low thermal expansion characteristics, and thus, a multicomponent-based glass material is used therefor. However, there is a problem that a multicomponent-based glass material is less liable to attain a high level of smoothness compared with synthetic quartz glass. In a quest to solve this problem, a thin film formed of a metal or an alloy, or a material containing any one of these and at least one of oxygen, nitrogen, and carbon is formed on the substrate 10 formed of a multicomponent-based glass material. By mirror polishing and surface treating a surface of such a thin film, a desired surface can be formed relatively easily.

In particular, the following material is preferred as the material for the thin film: tantalum (Ta), an alloy containing Ta, or a Ta compound containing any one of Ta and the alloy containing Ta as well as at least one of oxygen, nitrogen, and carbon. For example, the following material may be applied as the Ta compound: TaB, TaN, TaO, TaON, TaCON, TaBN, TaBO, TaBON, TaBCON, TaHf, TaHfO, TaHfN, TaHfON, TaHfCON, TaSi, TaSiO, TaSiN, TaSiON, or TaSiCON. Of those Ta compounds, the following nitrogen (N)-containing compound is more preferred: TaN, TaON, TaCON, TaBN, TaBON, TaBCON, TaHfN, TaHfON, TaHfCON, TaSiN, TaSiON, or TaSiCON. Note that, from the viewpoint of high smoothness of the surface of the thin film, the thin film preferably have an amorphous structure. A crystal structure of the thin film can be measured by an X-ray diffractometer (XRD).

[Substrate 20 Provided with Multilayer Reflective Film]

Next, the substrate 20 provided with a multilayer reflective film that can be used for the back surface conductive film 23 and the reflective mask blank 30 according to this invention is described below.

FIG. 3 is a schematic view for illustrating an exemplary substrate 20 provided with a multilayer reflective film that can be used for the back surface conductive film 23 and the reflective mask blank 30 according to this invention. FIG. 4 is a schematic view for illustrating another exemplary substrate 20 provided with a multilayer reflective film according to this invention. As illustrated in FIG. 4, when the substrate 20 provided with a multilayer reflective film has the predetermined back surface conductive film 23, the substrate 20 provided with a multilayer reflective film is a kind of the back surface conductive film 23 according to this invention. In this specification, both of the substrates 20 provided with a multilayer reflective film illustrated in FIG. 3 and FIG. 4 are referred to as the substrate 20 provided with a multilayer reflective film according to this embodiment.

The substrate 20 provided with a multilayer reflective film according to this embodiment has a structure in which the multilayer reflective film 21 is formed on the main surface of the substrate 10 for a mask blank described above on the side on which the transfer pattern is to be formed. The multilayer reflective film 21 gives the function of reflecting EUV light to the reflective mask 40 for EUV lithography, and the multilayer reflective film 21 has a structure in which elements having different refractive indices are periodically laminated.

A material of the multilayer reflective film 21 is not specifically limited insofar as EUV light is reflected, but the material alone generally has a reflectivity of 65% or more, and an upper limit thereof is generally 73%. Such a multilayer reflective film 21 can typically be the multilayer reflective film 21 in which a thin film formed of a material having a high refractive index (high refractive index layer) and a thin film formed of a material having a low refractive index (low refractive index layer) are alternately laminated for about 40 cycles to about 60 cycles.

For example, it is preferred that the multilayer reflective film 21 for EUV light having a wavelength of from 13 nm to 14 nm be an Mo/Si periodic multilayer firm in which an Mo film and a Si film are alternately laminated for about 40 cycles. Other than this, as the multilayer reflective film 21 used in a region of EUV light, a Ru/Si periodic multilayer firm, an Mo/Be periodic multilayer firm, an Mo compound/Si compound periodic multilayer firm, a Si/Nb periodic multilayer firm, a Si/Mo/Ru periodic multilayer firm, a Si/Mo/Ru/Mo periodic multilayer firm, a Si/Ru/Mo/Ru periodic multilayer firm, or the like can be used.

A method of forming the multilayer reflective film 21 is publicly known in the art, and the formation can be carried out by forming the layers by, for example, magnetron sputtering or ion beam sputtering. In the case of the Mo/Si periodic multilayer firm described above, for example, by ion beam sputtering, first, a Si film having a thickness of about several nanometers is formed on the substrate 10 using a Si target, and after that, an Mo film having a thickness of about several nanometers is formed using an Mo target, and the cycle is repeated for 40 cycles to 60 cycles to laminate the layers and to form the multilayer reflective film 21.

When the substrate 20 provided with a multilayer reflective film according to this embodiment is manufactured, it is preferred that the multilayer reflective film 21 be formed by ion beam sputtering in which an ion beam is alternately radiated to a sputtering target of a material having a high refractive index and a sputtering target of a material having a low refractive index. By forming the multilayer reflective film 21 by the predetermined ion beam sputtering, the multilayer reflective film 21 having satisfactory reflectivity characteristics for EUV light can be obtained with reliability.

With regard to the substrate 20 provided with a multilayer reflective film according to this embodiment, it is preferred that the multilayer firm 26 for a mask blank further include the protective film 22 arranged so as to be in contact with a surface of the multilayer reflective film 21 on a side opposite to the substrate 10 for a mask blank.

The protective film 22 (see FIG. 5) can be formed on the multilayer reflective film 21 formed as described above for the purpose of protecting the multilayer reflective film 21 from dry etching and wet cleaning in a manufacturing process of the reflective mask 40 for EUV lithography. An embodiment in which the multilayer reflective film 21 and the protective film 22 are formed on the substrate 10 for a mask blank as described above can also be the substrate 20 provided with a multilayer reflective film according to this embodiment.

Note that, a material such as Ru, Ru—(Nb, Zr, Y, B, Ti, La, Mo), Si—(Ru, Rh, Cr, B), Si, Zr, Nb, La, or B may be used as a material for the protective film 22. Of those, the application of a ruthenium (Ru)-containing material results in better reflectivity characteristics of the multilayer reflective film 21. Specifically, the material is preferably Ru or Ru—(Nb, Zr, Y, B, Ti, La, Mo). The protective film 22 is particularly effective when the absorber film 24 is of a Ta-based material and the absorber film 24 is patterned by dry etching with a Cl-based gas.

For the purpose of forming the multilayer reflective film 21 or the protective film 22 to have a satisfactory geometry, it is preferred that, in forming the multilayer reflective film 21, the high refractive index layer and the low refractive index layer be formed by sputtering so as to be deposited diagonally with respect to a normal to the main surface of the substrate 10. More specifically, it is good that, in the film formation, an incident angle of sputtering particles for forming a low refractive index layer of Mo or the like and an incident angle of sputtering particles for forming a high refractive index layer of Si or the like be more than 0 degrees and 45 degrees or less. The angles are more preferably more than 0 degrees and 40 degrees or less, and further preferably more than 0 degrees and 30 degrees or less. Further, it is preferred that the protective film 22 formed on the multilayer reflective film 21 be formed by ion beam sputtering so that the protective film 22 is also deposited diagonally with respect to the normal to the main surface of the substrate 10 successively after the multilayer reflective film 21 is formed.

[Substrate 50 Provided with Conductive Film]

Next, the substrate 50 provided with a conductive film according to this invention is described. In the substrate 20 provided with a multilayer reflective film illustrated in FIG. 3, by forming the predetermined back surface conductive film 23 on the surface of the substrate 10 on the side opposite to the surface in contact with the multilayer reflective film 21, the substrate 50 provided with a conductive film according to this invention (substrate 20 provided with a multilayer reflective film according to this invention) as illustrated in FIG. 4 can be obtained. Note that, as illustrated in FIG. 2, by forming the predetermined back surface conductive film 23 on one surface of the main surfaces of the substrate 10 for a mask blank, the substrate 50 provided with a conductive film according to this invention can be obtained.

An electrical characteristic (sheet resistance) required of the back surface conductive film 23 is ordinarily 100 Ω/□ less. A method of forming the back surface conductive film 23 is publicly known, and the formation can be performed by, for example, magnetron sputtering or ion beam sputtering using a target of a metal such as Cr or Ta or an alloy thereof.

It is preferred that the back surface conductive film 23 be formed by sputtering using a sputtering target that contains a metal as a material of the conductive film. Specifically, it is preferred that the back surface conductive film 23 be formed by, under a state in which the surface of the substrate 10 on which the back surface conductive film 23 is to be formed faces upward and the substrate 10 is rotated on a horizontal plane, sputtering a sputtering target opposed to the surface on which the film is to be formed so as to be slanted at a predetermined angle, at a position at which a central axis of the substrate 10 and a straight line that passes through a center of the sputtering target and that is in parallel with the central axis of the substrate 10 are not spatially coherent. It is preferred that the predetermined angle of the slanted sputtering target be 5 degrees or more and 30 degrees or less. Further, it is preferred that a gas pressure in the film formation by sputtering be 0.05 Pa or more and 0.5 Pa or less. By forming the back surface conductive film 23 by such a method, in the substrate 50 provided with a conductive film, the relationship between the bearing area (%) and the bearing depth (nm) that are obtained by measuring, with an atomic force microscope, a region of 1 μm×1 μm of the surface of the back surface conductive film 23 can be the predetermined relationship, and the maximum height (Rmax) of the surface roughness can be in the predetermined range.

Further, in the substrate 50 provided with a conductive film according to this invention, an underlayer may be formed between the substrate 10 and the multilayer reflective film 21. The underlayer can be formed for the purpose of improving the smoothness of the main surface of the substrate 10, for the purpose of reducing defects, for the purpose of an effect of enhancing the reflectivity of the multilayer reflective film 21, and for the purpose of correcting stress on the multilayer reflective film 21.

[Reflective Mask Blank 30]

Next, the reflective mask blank 30 according to this invention is described. FIG. 5 is a schematic view for illustrating an exemplary reflective mask blank 30 according to this invention. The reflective mask blank 30 according to this invention has a structure in which the absorber film 24 to be the transfer pattern is formed on the multilayer reflective film 21 or on the protective film 22 of the substrate 20 provided with a multilayer reflective film described above.

The absorber film 24 has the function of absorbing EUV light as exposure light, and it is enough that, in the reflective mask 40 manufactured using the reflective mask blank 30, there is a desired reflectivity difference between light reflected by the multilayer reflective film 21 or the protective film 22 and light reflected by an absorber pattern 27.

For example, the absorber film 24 is set to have a reflectivity of 0.1% or more and 40% or less for EUV light. Further, there may be, in addition to the reflectivity difference described above, a desired phase difference between light reflected by the multilayer reflective film 21 or the protective film 22 and light reflected by the absorber pattern 27. Note that, when there is the desired phase difference between such reflected lights, there is a case in which the absorber film 24 in the reflective mask blank 30 is referred to as a phase shift film.

When the desired phase difference is provided between the reflected lights to improve contrast of light obtained by being reflected by the reflective mask 40, it is preferred that the phase difference be set in a range of 180 degrees±10 degrees, the absorber film 24 be set to have an absolute reflectivity of 1.5% or more and 30% or less, and the absorber film 24 have a reflectivity of 2% or more and 40% or less with respect to the surface of the multilayer reflective film 21 and/or the protective film 22.

The absorber film 24 may be a single layer or may have a laminated structure. In the case of the laminated structure, the absorber film 24 may be any one of a laminated film of the same material and a laminated film of different materials. The material or composition of the laminated film may be changed in stages and/or continuously in a thickness direction.

A material of the absorber film 24 is not specifically limited. For example, it is preferred that a material having the function of absorbing EUV light, and formed solely of Ta (tantalum) or containing Ta as a main component thereof be used. The material that contains Ta as a main component thereof is ordinarily an alloy of Ta. It is preferred that, from the viewpoint of smoothness and flatness, a crystal state of the absorber film 24 be amorphous or microcrystalline. As the material that contains Ta as a main component thereof, for example, a material containing Ta and B, a material containing Ta and N, a material containing Ta and B, and further containing at least any one of O and N, a material containing Ta and Si, a material containing Ta, Si, and N, a material containing Ta and Ge, a material containing Ta, Ge, and N, or the like can be used. Further, for example, by adding B, Si, Ge, or the like to Ta, an amorphous structure can be easily obtained to improve the smoothness. Further, by further adding N or O to Ta, resistance to oxidation can be improved to improve stability over time. It is preferred that the absorber film 24 have a microcrystalline structure or an amorphous structure. The crystal structure can be confirmed using an X-ray diffractometer (XRD).

Specific examples of the tantalum-containing material for forming the absorber film 24 include a tantalum metal and a material containing tantalum as well as one or more elements selected from nitrogen, oxygen, boron and carbon and being substantially free of hydrogen. Examples thereof include Ta, TaN, TaON, TaBN, TaBON, TaCN, TaCON, TaBCN, and TaBOCN. The material described above may contain a metal other than tantalum insofar as the effect of this invention can be obtained. When the material containing tantalum that forms the absorber film 24 contains boron, it is easy to control the absorber film 24 so as to have an amorphous structure (non-crystalline).

It is preferred that the absorber film 24 of the reflective mask blank according to this invention be formed of a material containing tantalum and nitrogen. A nitrogen content in the absorber film 24 is preferably 30 at % or less, more preferably 25 at % or less, and further preferably 20 at % or less. It is preferred that the nitrogen content in the absorber film 24 be 5 at % or more.

In the reflective mask blank 30 according to this invention, it is preferred that the absorber film 24 contain tantalum and nitrogen, and the nitrogen content therein be 10 at % or more and 50 at % or less. The absorber film 24 contains tantalum and nitrogen, and the nitrogen content is 10 at % or more and 50 at % or less, and thus, on a surface of the absorber film 24, the predetermined relationship between the bearing area (%) and the bearing depth (nm) and the predetermined range of the maximum height (Rmax) that are described above can be obtained. Further, increase in size of crystal particles that form the absorber film 24 can be inhibited, and thus, pattern edge roughness when the absorber film 24 is patterned can be reduced.

In the reflective mask blank 30 according to this invention, the thickness of the absorber film 24 is set to be a thickness that is necessary for the difference between light reflected by the multilayer reflective film 21 or the protective film 22 and light reflected by the absorber pattern 27 is the desired reflectivity difference. It is preferred that the thickness of the absorber film 24 be 60 nm or less for the purpose of reducing a shadowing effect.

Further, in the reflective mask blank 30 according to this invention, the absorber film 24 can have a phase shift function of having the desired phase difference between light reflected by the multilayer reflective film 21 or the protective film 22 and light reflected by the absorber pattern 27. In that case, the reflective mask blank 30 as a master for the reflective mask 40 with improved transfer resolution by EUV light is obtained. Further, the thickness of the absorber film 24 necessary for exerting a phase shift effect necessary for obtaining the desired transfer resolution can be thinner than a related-art one, and thus, a reflective mask blank with a reduced shadowing effect is obtained.

A material of the absorber film 24 having the phase shift function is not particularly limited. For example, sole Ta or a material that contains Ta as a main component thereof described above may be used, and other materials may also be used. Examples of the materials other than Ta include Ti, Cr, Nb, Mo, Ru, Rh, and W. In addition, examples thereof may include: an alloy containing two or more elements of Ta, Ti, Cr, Nb, Mo, Ru, Rh, and W; and a laminate film of those elements. In addition, these materials may each contain one or more elements selected from nitrogen, oxygen, and carbon.

Note that, when the absorber film 24 is a laminated film, the absorber film 24 may be a laminated film of layers of the same material or a laminated film of layers of different materials. When the absorber film 24 is a laminated film of layers of different materials, materials forming the plurality of layers may have etching characteristics different from one another so that the absorber film 24 has the function of an etching mask.

Note that, the reflective mask blank 30 according to this invention is not limited to the structure illustrated in FIG. 5. For example, a resist film to be a mask for patterning the absorber film 24 may be formed on the absorber film 24, and the reflective mask blank 30 provided with the resist film can also be the reflective mask blank 30 according to this invention. Note that, the resist film formed on the absorber film 24 may be a positive type or a negative type. Further, the resist film may be for drawing with an electron beam or may be for drawing with a laser. Further, a so-called hard mask film (etching mask film 25) may be formed between the absorber film 24 and the resist film, and this embodiment can also be the reflective mask blank 30 according to this invention.

It is preferred that, in the reflective mask blank 30 according to this invention, the multilayer firm 26 for a mask blank further include the etching mask film 25 arranged so as to be in contact with a surface of the absorber film 24 on a side opposite to the substrate 10 for a mask blank. In the case of the reflective mask blank 30 illustrated in FIG. 7, the multilayer firm 26 for a mask blank on the main surface of the substrate 10 for a mask blank further has the etching mask film 25 in addition to the multilayer reflective film 21, the protective film 22, and the absorber film 24. The reflective mask blank 30 according to this invention can further have a resist film on an outermost surface of the multilayer firm 26 for a mask blank of the reflective mask blank 30 illustrated in FIG. 7.

Specifically, the reflective mask blank 30 according to this invention has a structure in which, when sole Ta or a material that contains Ta as a main component thereof is used as the material of the absorber film 24, the etching mask film 25 formed of a material containing chromium is formed on the absorber film 24. When the reflective mask blank 30 has such a structure, even if, after the transfer pattern is formed in the absorber film 24, the etching mask film 25 is separated by dry etching using a gas mixture of a chlorine-based gas and oxygen gas, the reflective mask 40 in which optical characteristics of the absorber pattern 27 are satisfactory can be manufactured. Further, the reflective mask 40 in which line edge roughness of the transfer pattern formed in the absorber film 24 is satisfactory can be manufactured.

An example of the chromium-containing material for forming the etching mask film 25 is a material containing chromium as well as one or more elements selected from nitrogen, oxygen, carbon, and boron. Examples thereof include CrN, CrON, CrCN, CrCON, CrBN, CrBON, CrBCN, and CrBOCN. The material described above may contain a metal other than chromium insofar as the effect of this invention can be obtained. From the viewpoint of obtaining the function as an etching mask for accurately forming the transfer pattern in the absorber film 24, it is desired that the etching mask film 25 have a thickness of 3 nm or more. Further, from the viewpoint of reducing the thickness of the resist film, it is desired that the etching mask film 25 have a thickness of 15 nm or less.

Next, a method of manufacturing the reflective mask blank 30 according to this invention is described under a state in which the substrate 20 provided with a multilayer reflective film illustrated in FIG. 4 is a starting material. In the method of manufacturing the reflective mask blank 30 according to this invention, the absorber film 24 is formed on the multilayer reflective film 21 that is formed on the main surface of the substrate 10 for a mask blank. Note that, when the substrate 20 provided with a multilayer reflective film illustrated in FIG. 2 is used, the predetermined back surface conductive film 23 is further formed on the back surface of the substrate 10 as described above.

In a step of forming the absorber film 24 in the method of manufacturing the reflective mask blank 30 according to this invention, it is preferred that the absorber film 24 be formed by reactive sputtering using a sputtering target formed of a material contained in the absorber film 24, and the absorber film 24 be formed so as to contain a component contained in an atmospheric gas in the reactive sputtering. In the film formation by reactive sputtering, through adjustment of the flow rate of the atmospheric gas, adjustment can be made so that the surface shape is a predetermined shape.

When the absorber film 24 is formed by reactive sputtering, it is preferred that the atmospheric gas be a gas mixture including an inert gas and nitrogen gas. In this case, the flow rate of nitrogen can be adjusted, and thus, the absorber film 24 having appropriate composition can be obtained.

In the method of manufacturing the reflective mask blank 30 according to this invention, it is preferred that the absorber film 24 be formed using a sputtering target of a material containing tantalum. As a result, the absorber film 24 that contains tantalum and that appropriately absorbs light can be formed.

It is preferred that the method of manufacturing the reflective mask blank 30 according to this invention further include a step of forming the protective film 22 arranged so as to be in contact with the surface of the multilayer reflective film 21. By forming the protective film 22, damage to the surface of the multilayer reflective film 21 when the reflective mask (EUV mask) is manufactured can be inhibited, and thus, the reflectivity characteristics for EUV light becomes more satisfactory. Further, in the reflective mask blank 30 that is manufactured, detection of a pseudo defect in defect inspection of the surface of the protective film 22 using a highly sensitive defect inspection apparatus can be inhibited to further clarify a critical defect.

It is preferred that the protective film 22 be formed by ion beam sputtering in which an ion beam is radiated to a sputtering target of a material of the protective film 22. By the ion beam sputtering, the surface of the protective film 22 can be smoothed, and thus, the surface of the absorber film 24 formed on the protective film 22, and further, a surface of the etching mask film 25 formed on the absorber film 24 can be smoothed.

It is preferred that the method of manufacturing the reflective mask blank 30 according to this invention further include a step of forming the etching mask film 25 arranged so as to be in contact with the surface of the absorber film 24. By forming the etching mask film 25 having dry etching characteristics that are different from those of the absorber film 24, the transfer pattern formed in the absorber film 24 can be highly accurate.

[Reflective Mask 40]

Figure 6:
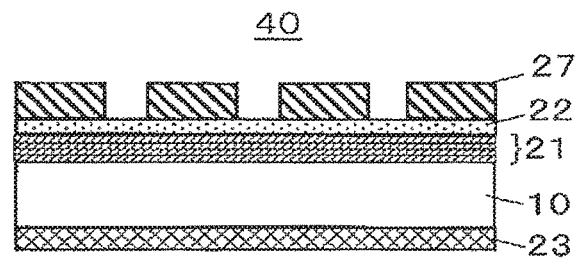
FIG. 6 is a schematic sectional view for illustrating an exemplary reflective mask according to an embodiment of this invention.

Next, the reflective mask 40 according to an embodiment of this invention is described below. FIG. 6 is a schematic view for illustrating the reflective mask 40 of this embodiment.

The reflective mask 40 according to this invention has a structure in which the absorber film 24 in the reflective mask blank 30 described above is patterned to form the absorber pattern 27 on the multilayer reflective film 21 or on the protective film 22. In the reflective mask 40 according to this embodiment, when exposure is performed with exposure light such as EUV light, the exposure light is absorbed by portions of the surface of the reflective mask 40 on which the absorber film 24 is formed and the exposure light is reflected by the exposed protective film 22 and multilayer reflective film 21 at other portions on which the absorber film 24 is removed, and thus, the reflective mask 40 according to this embodiment can be used as the reflective mask 40 for lithography. By using the reflective mask 40 according to this invention, when the reflective mask 40 is inspected and measured by a defect inspection apparatus, a coordinate measuring machine, and the like, slippage of the back surface conductive film when the substrate and the like are fixed by a mount can be inhibited.

[Method of Manufacturing Semiconductor Device]

By transferring a transfer pattern such as a circuit pattern based on the absorber pattern 27 of the reflective mask 40 to a resist film formed on a transfer target such as a semiconductor substrate in a lithography process using the reflective mask 40 described above and an exposure apparatus, and by various other steps, a semiconductor device in which various transfer patterns and the like are formed on the object to which transfer is performed such as a semiconductor substrate can be manufactured.

According to a method of manufacturing a semiconductor device of this invention, the reflective mask 40 without a critical defect such as a foreign matter or a flaw can be used in defect inspection using a highly sensitive defect inspection apparatus, and thus, the transfer pattern such as a circuit pattern that is transferred to a resist film formed on the object to which transfer is performed such as a semiconductor substrate has no defect, and a semiconductor device having a fine and highly accurate transfer pattern can be manufactured.

Note that, a fiducial mark 44 can be formed on the substrate 10 for a mask blank, the substrate 20 provided with a multilayer reflective film, and the reflective mask blank 30 described above, and positions of the fiducial mark 44 and of a critical defect detected by the highly sensitive defect inspection apparatus can be controlled based on coordinates thereof. Based on positional information of the critical defect (defect data) obtained, by correcting drawing data when the reflective mask 40 is manufactured so that the absorber pattern 27 is formed at a location where the critical defect exists based on the above-mentioned defect data and transferred pattern (circuit pattern) data, defects can be reduced.

EXAMPLES

Examples of manufacturing the substrate 20 provided with a multilayer reflective film for EUV exposure, the reflective mask blank 30, and the reflective mask 40 according to this invention are described below.

First, the multilayer reflective film 21 was formed on the surface of the substrate 10 for a mask blank for EUV exposure as described below to manufacture the substrate 20 provided with a multilayer reflective film of Examples 1 to 5 and Comparative Examples 1 and 2.

<Manufacture of Substrate 10 for Mask Blank>

The substrate 10 for a mask blank used in Examples 1 to 5 and Comparative Examples 1 and 2 was manufactured as described below.

As the substrate 10 for a mask blank, a $SiO_2$—$TiO_2$-based glass substrate sized to be 152 mm×152 mm and having a thickness of 6.35 mm was prepared. After front and back surfaces of the glass substrate were polished in stages with cerium oxide abrasive grain or colloidal silica abrasive grain using a double side polisher, surface treatment was applied with a low concentration of hydrofluosilicic acid. The surface roughness of a surface of the glass substrate obtained by this was measured with an atomic force microscope, and the root means square roughness (Rms) was 0.5 nm.

A surface shape (surface geometry, flatness) and TTV (Total Thickness Variation) of a region of 148 mm×148 mm of the front and back surfaces of the glass substrate were measured by a wavelength-shift interferometer using a wavelength-modulated laser. As a result, the flatness of the front and back surfaces of the glass substrate was 290 nm (convex). The result of the measurement of the surface shape (flatness) of the front surface of the glass substrate was stored in a computer as height information with respect to a certain reference level for each measurement point, and is compared with 50 nm as a reference value of the front surface flatness (convex) necessary for the glass substrate and with 50 nm as a reference value of the back surface flatness, and the difference (necessary removal amount) was computed by a computer.

Then, conditions of local surface treatment in accordance with the necessary removal amount were set with regard to each of treatment spot shape regions in the glass substrate surfaces. A treatment volume of a spot per unit time was calculated in advance using a dummy substrate by treating the dummy substrate spot by spot without moving the substrate for a predetermined period of time similarly to actual treatment, and the shape was measured by the apparatus for measuring the surface shapes of the front and back surfaces. In accordance with the necessary removal amount obtained from spot information and surface shape information of the glass substrate, a scanning speed in raster scanning of the glass substrate was determined.

In accordance with the set treatment conditions, local surface treatment processing was performed so that the flatness of the front and back surfaces of the glass substrate was equal to or smaller than the reference value described above by magnetic viscoelastic fluid polishing (Magneto Rheological Finishing: MRF) treatment using a substrate finishing apparatus with a magnetic viscoelastic fluid to adjust the surface shape. Note that, the magnetic viscoelastic fluid used in this case contained an iron component, and an alkaline aqueous solution containing about 2 wt % of cerium oxide as a polishing agent was used as polishing slurry. Then, after the glass substrate was soaked in a cleaning bath having a hydrochloric acid aqueous solution at about a 10% concentration (temperature of about 25° C.) for about 10 minutes, rinsing with pure water and drying with isopropyl alcohol (IPA) was performed.

The surface shape (surface geometry, flatness) of the surfaces of the glass substrate obtained was measured. The flatness of the front and back surfaces was about 40 to 50 nm. Further, the surface roughness of a surface of the glass substrate in a region of 1 μm×1 μm at an arbitrary location in a transfer pattern formation region (132 mm×132 mm) was measured with an atomic force microscope, and the root means square roughness (Rms) was 0.37 nm. The state was rougher compared with the surface roughness before the local surface treatment by MRF.

Therefore, both of the front and back surfaces of the glass substrate was polished using a double side polisher under polishing conditions in which the surface shape of the surface of the glass substrate was maintained or improved. Polishing conditions of the finishing polish was as follows.

Processing liquid: alkaline aqueous solution (NaOH)+ polishing agent (concentration: about 2 wt %)
Polishing agent: colloidal silica, average particle diameter: about 70 nm
Number of rotations of polishing plate: about 1 rpm to about 50 rpm
Processing pressure: about 0.1 kPa to about 10 kPa
Polishing time: about 1 min to about 10 min After that, the glass substrate was washed with the alkaline aqueous solution (NaOH). Thus, the substrate 10 for mask blank for EUV exposure was obtained.

The flatness and the surface roughness of the front and back surfaces of the substrate 10 for a mask blank obtained were measured. The flatness of the front and back surfaces was about 40 nm and the state before processing by the double side polisher was maintained or improved, which was satisfactory. Further, a region of 1 μm×1 μm at an arbitrary location in the transfer pattern formation region (132 mm×132 mm) of the substrate 10 for a mask blank obtained was measured with an atomic force microscope, and the surface roughness had a root means square roughness (Rms) of 0.13 nm and a maximum height (Rmax) of 1.2 nm.

Note that, the method of locally treating the substrate 10 for a mask blank according to this invention is not limited to the magnetic viscoelastic fluid polishing treatment described above. The treating method may also be Gas Cluster Ion Beams (GCIB) or a treating method using local plasma.

As described above, the substrate 10 for a mask blank used in Examples 1 to 5 and Comparative Examples 1 and 2 was manufactured.

<Manufacture of Multilayer Reflective Film 21>

The multilayer reflective film 21 of Examples 1 to 5 and Comparative Examples 1 and 2 was formed as follows. Specifically, an Mo layer (low refractive index layer having a thickness of 2.8 nm) and a Si layer (high refractive index layer having a thickness of 4.2 nm) were alternately laminated (40 pairs of laminates) by ion beam sputtering using an Mo target and a Si target to form the multilayer reflective film 21 on the substrate 10 for a mask blank described above. When the multilayer reflective film 21 was formed by ion beam sputtering, an incident angle of sputtering particles of Mo and Si with respect to the normal to the main surface of the substrate 10 for a mask blank in the ion beam sputtering was 30 degrees, and a gas flow rate of the ion sources was 8 sccm.

After the multilayer reflective film 21 was formed, an Ru protective film 22 (having a thickness of 2.5 nm) was further successively formed on the multilayer reflective film 21 by ion beam sputtering to form the substrate 20 provided with a multilayer reflective film. When the Ru protective film 22 was formed by ion beam sputtering, an incident angle of sputtering particles of Ru with respect to the normal to the main surface of the substrate 10 was 40 degrees, and a gas flow rate of the ion source was 8 sccm.

<Formation of Fiducial Mark 44>

Figure 10:
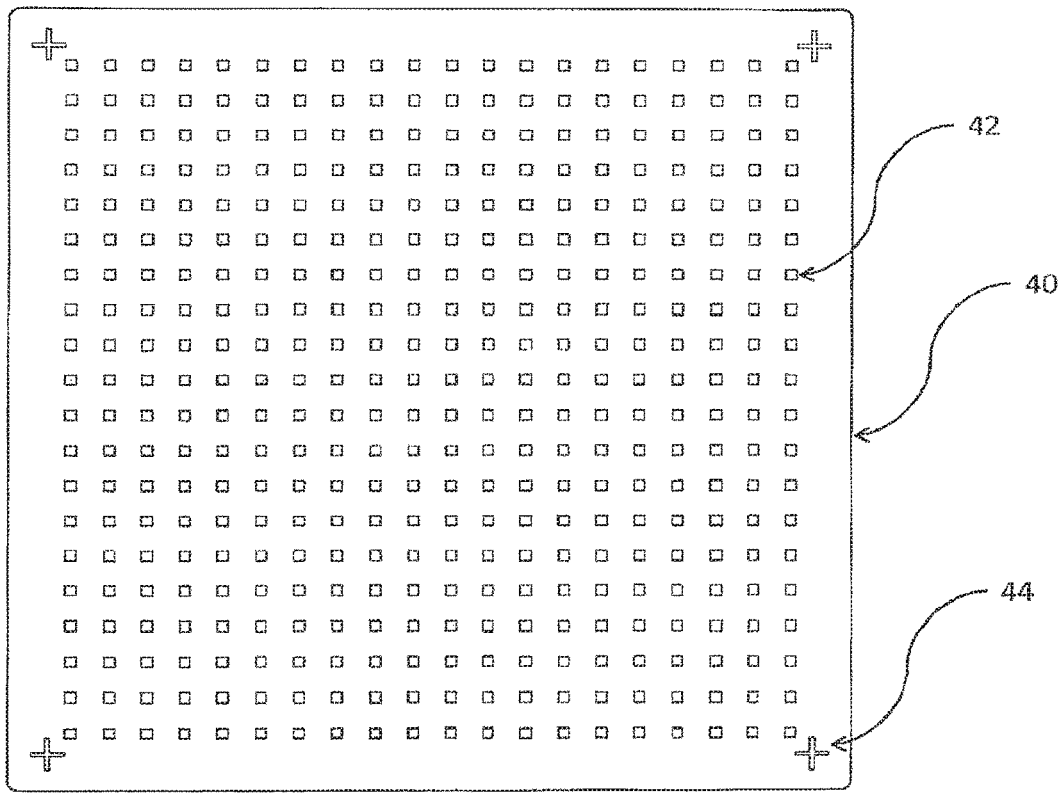
FIG. 10 is a schematic view of a mask for evaluating coordinate measurement having a fiducial mark and a pattern for evaluation.

Then, a cross-shaped fiducial mark 44 having a length of 550 μm was formed by photolithography at predetermined positions at four corners outside the region of 132 mm×132 mm of the Ru protective film 22 and the multilayer reflective film 21 of Examples 1 to 5 and Comparative Examples 1 and 2. First, a resist film was formed on a surface of the Ru protective film 22, and a pattern of the predetermined fiducial mark 44 was drawn and developed to form a resist pattern of the fiducial mark 44. Then, by dry etching the Ru protective film 22 and the substrate 20 provided with a multilayer reflective film with $ClF_3$ gas that was an F-based gas under a state in which the resist pattern was used as a mask, the fiducial mark 44 was formed in the Ru protective film 22 and the substrate 20 provided with a multilayer reflective film. After that, the resist pattern that became unnecessary was separated. FIG. 10 is an illustration of the reflective mask 40 having the fiducial mark 44.

<Manufacture of Absorber Film 24>

Then, the absorber film 24 was formed on the surface of the protective film 22 of the substrate 20 provided with a multilayer reflective film of Examples 1 to 5 and Comparative Examples 1 and 2 described above by DC magnetron sputtering. The absorber film 24 was the absorber film 24 of laminated films of two layers of a TaBN film as an absorbing layer and a TaBO film as a low reflection layer. A method of forming the absorber film 24 in Examples 1 to 5 and Comparative Examples 1 and 2 is as follows.

First, the TaBN film as the absorbing layer was formed on the surface of the protective film 22 of the substrate 20 provided with a multilayer reflective film described above by DC magnetron sputtering. The TaBN film was formed by reactive sputtering in an atmosphere of a gas mixture of Ar gas and $N_2$ gas under a state in which the substrate 20 provided with a multilayer reflective film was opposed to a TaB mixture-sintered target (Ta:B=80:20 in atomic ratio). Table 1 shows film formation conditions such as flow rates of the Ar gas and the $N_2$ gas when the TaBN film was formed. After the film formation, element composition of the TaBN film was measured by X-ray photoelectron spectroscopy (XPS). Table 1 shows, together with the thickness of the TaBN film, the element composition of the TaBN film measured by XPS. Note that, a crystal structure of the TaBN film was measured by X-ray diffractometer (XRD), and that turned out to be an amorphous structure.

Next, the TaBO film (low reflection layer) containing Ta, B, and O was further formed on the TaBN film by DC magnetron sputtering. As in the case of the TaBN film, which is a first layer, the TaBO film was formed by reactive sputtering in an atmosphere of a gas mixture of Ar gas and $O_2$ gas under a state in which the substrate 20 provided with a multilayer reflective film was opposed to the TaB mixture-sintered target (Ta:B=80:20 in atomic ratio). Table 1 shows film formation conditions such as flow rates of the Ar gas and the $O_2$ gas when the TaBO film was formed. After the film formation, element composition of the TaBO film was measured by X-ray photoelectron spectroscopy (XPS). Table 1 shows, together with the thickness of the TaBO film, the element composition of the TaBO film measured by XPS. Note that, a crystal structure of the TaBO film was measured by X-ray diffractometer (XRD), and that turned out to be an amorphous structure. As described above, the absorber film 24 (laminated film) of Examples 1 to 5 and Comparative Examples 1 and 2 was formed.

TABLE 1

| | | Target material | TaB mixture-sintered target (Ta:B = 80:20 in atomic ratio) |
|---|---|---|---|
| Absorbing layer | Film forming gas | Ar (sccm) | 12.4 |
| | | $N_2$ (sccm) | 6.0 |
| | Film composition (by XPS) | | TaBN layer |
| | | Ta (at %) | 74.7 |
| | | B (at %) | 12.1 |
| | | N (at %) | 13.2 |
| | Film thickness (nm) | | 56 |

| | | Target material | (same as absorbing layer) |
|---|---|---|---|
| Low reflection layer | Film forming gas | Ar (sccm) | 57.0 |
| | | $O_2$ (sccm) | 28.6 |
| | Film composition (by XPS) | | TaBO layer |
| | | Ta (at %) | 40.7 |
| | | B (at %) | 6.3 |
| | | O (at %) | 53.0 |
| | Film thickness (nm) | | 14 |
| Total film thickness (nm) | | | 70 |

<Manufacture of Back Surface Conductive Film 23>

The back surface conductive film 23 was formed on the back surface of the substrate 20 provided with a multilayer reflective film of Examples 1 to 5 and Comparative Examples 1 and 2, on which the multilayer reflective film 21 was not formed, by DC magnetron sputtering as follows. In Table 2, the composition, thickness, and the like of the back surface conductive film 23 that was formed are shown.

Manufacture of Back Surface Conductive Film 23 of Example 1

The back surface conductive film 23 of Example 1 was formed as follows. Specifically, reactive sputtering was performed using a gas mixture of Ar gas (flow rate: 24 sccm) and $N_2$ gas (flow rate: 6 sccm) as a film forming gas under a state in which a Cr target was opposed to the back surface of the substrate 20 provided with a multilayer reflective film. Through adjustment of a period of time for forming the back surface conductive film 23, the back surface conductive film 23 of Example 1 had a thickness of 20 nm.

Manufacture of Back Surface Conductive Film 23 of Example 2

As the back surface conductive film 23 of Example 2, the back surface conductive film 23 including three layers of CrN/CrCN/CrON was formed by sputtering using an inline sputtering apparatus. First, a CrN film having a thickness of 15 nm was formed by reactive sputtering using a chromium target in an atmosphere of a gas mixture of argon (Ar) and nitrogen (N) (Ar: 72 vol %, $N_2$: 28 vol %, under a pressure of 0.3 Pa). Then, a CrC film having a thickness of 25 nm was formed by reactive sputtering using a chromium target in an atmosphere of a gas mixture of argon and methane (Ar: 96.5 vol %, $CH_4$: 3.5 vol %, under a pressure of 0.3 Pa). Note that, the film formation was performed using an inline sputtering apparatus, and thus, the CrC film contained N, and the film was actually a CrCN film. Finally, a CrON film having a thickness of 20 nm was formed by reactive sputtering using a chromium target in an atmosphere of a gas mixture of argon and nitric oxide (Ar: 87.5 vol %, NO: 12.5 vol %, under a pressure of 0.3 Pa). A nitrogen content of the CrN film obtained was 20 at %, a carbon content of the CrC film (CrCN film) was 6 at %, and an oxygen content and a nitrogen content of the CrON film were 45 at % and 25 at %, respectively. Note that, the film thicknesses described above were film thicknesses when a single layer was formed. After the three layers of CrN/CrCN/CrON were formed, a thickness of the entire three layers was measured to be 70 nm.

Manufacture of Back Surface Conductive Film 23 of Example 3

The back surface conductive film 23 of Example 3 was formed under the same conditions as those of the back surface conductive film 23 of Example 1 except that the thickness thereof was 50 nm through adjustment of a period of time for the formation thereof.

Manufacture of Back Surface Conductive Film 23 of Example 4

The back surface conductive film of Example 4 was formed as follows. Specifically, reactive sputtering was performed using a gas mixture of Ar gas (flow rate: 48 sccm) and $N_2$ gas (flow rate: 6 sccm) as a film forming gas under a state in which a Cr target was opposed to the back surface of the substrate 20 provided with a multilayer reflective film. Through adjustment of a period of time for forming the back surface conductive film 23, the back surface conductive film 23 of Example 4 had a thickness of 200 nm.

Manufacture of Back Surface Conductive Film 23 of Example 5

The back surface conductive film 23 of Example 5 was formed as follows. Specifically, reactive sputtering was performed using a gas mixture of Xe gas (flow rate: 12 sccm) and $N_2$ gas (flow rate: 6 sccm) as a film forming gas under a state in which a Ta target was opposed to the back surface of the substrate 20 provided with a multilayer reflective film. Through adjustment of a period of time for forming the back surface conductive film 23, the back surface conductive film 23 of Example 5 had a thickness of 70 nm.

Manufacture of Back Surface Conductive Film 23 of Comparative Example 1

The back surface conductive film 23 of Comparative Example 1 was formed under the same conditions as those of the back surface conductive film 23 of Example 1 except that the thickness thereof was 200 nm through adjustment of a period of time for the formation thereof.

Manufacture of Back Surface Conductive Film 23 of Comparative Example 2

The back surface conductive film 23 of Comparative Example 2 was formed under the same conditions as those of the back surface conductive film 23 of Example 1 and Comparative Example 1 described above except that a mixture ratio of the film forming gas was such that Ar gas had a flow rate of 24 sccm and $N_2$ gas had a flow rate of 8 sccm. Further, through adjustment of a period of time for forming the back surface conductive film 23, the back surface conductive film 23 of Comparative Example 2 had a thickness of 20 nm.

As described above, the reflective mask blank 30 of Examples 1 to 5 and Comparative Examples 1 and 2 was obtained.

<Measurement with Atomic Force Microscope>

A region of 1 μm×1 μm at an arbitrary location (specifically, at the center of the substrate having the back surface conductive film 23 formed thereon, and a position at which the mount of a coordinate measuring machine abuts the back surface conductive film 23) of the surface of the back surface conductive film 23 of the reflective mask blank 30 obtained as Examples 1 to 5 and Comparative Examples 1 and 2 was measured with an atomic force microscope. In Table 2 and Table 3, values of the surface roughness (Rmax, Rms) obtained by measurement with an atomic force microscope and of $(BA_{70}-BA_{30})/(BD_{70}-BD_{30})$ (%/nm) when the bearing area of 30% is defined as $BA_{30}$, the bearing area of 70% is defined as $BA_{70}$, and the bearing depths corresponding to the bearing areas of 30% and 70% are defined as $BD_{30}$ and $BD_{70}$, respectively, are shown. Note that, the values of the surface roughness (Rmax, Rms) and of $(BA_{70}-BA_{30})/(BD_{70}-BD_{30})$ shown in Table 2 and Table 3 are average values of measurements that were made ten times.

Figure 8:
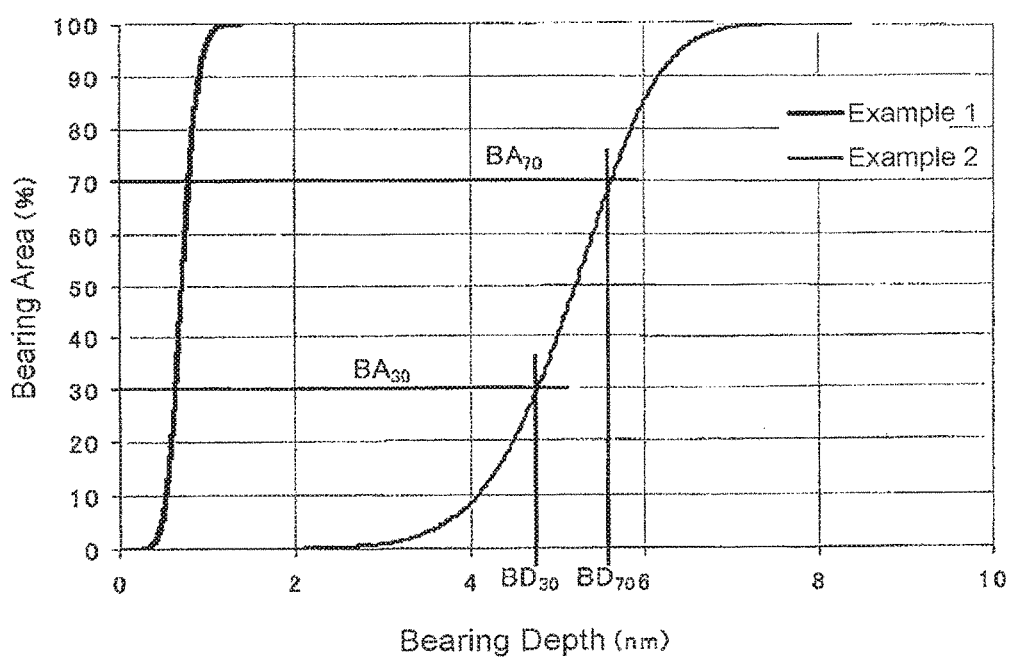
FIG. 8 is a graph for showing results of bearing curve measurement of surface roughness of a back surface conductive film of a reflective mask blank of Examples 1 and 2 of this invention.
Figure 9:
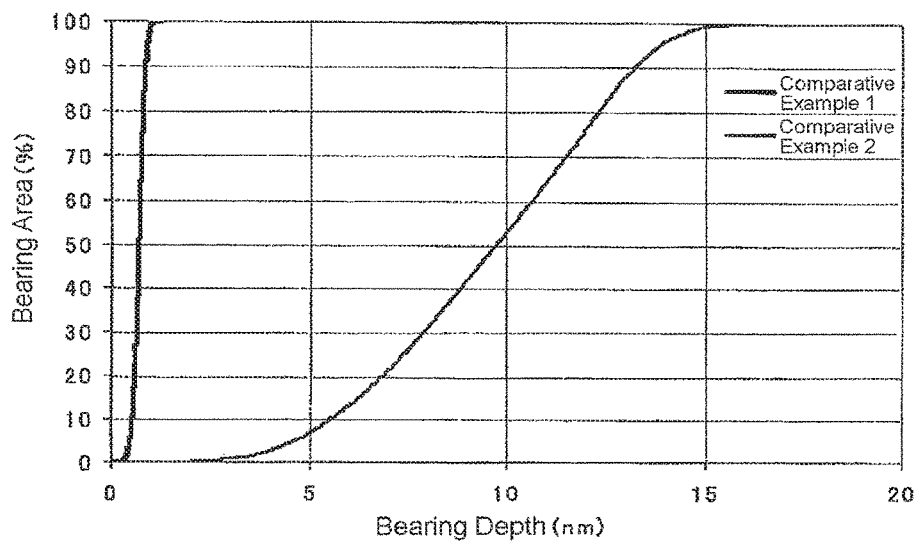
FIG. 9 is a graph for showing results of bearing curve measurement of surface roughness of a back surface conductive film of a reflective mask blank of Comparative Examples 1 and 2.

In FIG. 8, results of bearing curve measurement of Examples 1 and 2 are shown. In FIG. 9, results of bearing curve measurement of Comparative Examples 1 and 2 are shown. In FIG. 8 and FIG. 9, the vertical axis denotes the bearing area (%) and the horizontal axis denotes the bearing depth (nm). For reference purposes, $BA_{70}$, $BA_{30}$, $BD_{70}$, and $BD_{30}$ in the result of bearing curve measurement of Example 2 are shown in FIG. 8.

TABLE 2

|  | Example 1 | Example 2 | Comparative Example 1 | Comparative Example 2 |
|---|---|---|---|---|
| Back surface conductive film material | CrN | CrN/CrCN/CrON | CrN | CrN |
| Film thickness (nm) | 20 | 70 | 200 | 20 |
| Rmax (nm) | 1.53 | 8.15 | 17.7 | 1.26 |
| Rms (nm) | 0.152 | 0.83 | 2.89 | 0.141 |
| Ratio in bearing curve $(BA_{70}-BA_{30})/(BD_{70}-BD_{30})$ (%/nm) | 258.065 | 46.893 | 10.979 | 275.86 |
| Measurement accuracy of coordinates of pattern for evaluation (nm) | 2.4 | 2.2 | 2.1 | 8.0 |
| Defect inspection of surface of back surface conductive film is enabled/disabled | ○ | ○ | x | ○ |

TABLE 3

|  | Example 3 | Example 4 | Example 5 |
|---|---|---|---|
| Back surface conductive film material | CrN | CrN | TaN |
| Film thickness (nm) | 50 | 200 | 70 |
| Rmax (nm) | 3.27 | 14.8 | 2.84 |
| Rms (nm) | 0.355 | 1.432 | 0.343 |
| Ratio in bearing curve $(BA_{70}-BA_{30})/(BD_{70}-BD_{30})$ (%/nm) | 111.1 | 19.1 | 111.1 |
| Measurement accuracy of coordinates of pattern for evaluation (nm) | 2.3 | 2.1 | 2.4 |
| Defect inspection of surface of back surface conductive film is enabled/disabled | ○ | ○ | ○ |

In the cases of Examples 1 and 2 shown in FIG. 8, the values of $(BA_{70}-BA_{30})/(BD_{70}-BD_{30})$ were 258.065(%/nm) and 46.893(%/nm), respectively, which were in the range of from 15(%/nm) to 260(%/nm). On the other hand, in the cases of Comparative Examples 1 and 2 shown in FIG. 9, the values of $(BA_{70}-BA_{30})/(BD_{70}-BD_{30})$ were 10.979(%/nm) and 275.86(%/nm), respectively, which were outside the range of from 15(%/nm) to 260(%/nm).

Further, in Example 3, the value of $(BA_{70}-BA_{30})/(BD_{70}-BD_{30})$ was 111.1(%/nm), in Example 4, the value of $(BA_{70}-BA_{30})/(BD_{70}-BD_{30})$ was 19.1(%/nm), and in Example 5, the value of $(BA_{70}-BA_{30})/(BD_{70}-BD_{30})$ was 111.1(%/nm), which were in the range of from 15(%/nm) to 260(%/nm).

Further, as shown in Table 2 and Table 3, in a region of 1 μm×1 μm of the surface of the back surface conductive film 23 of Examples 1 to 5, the maximum height (Rmax) of the surface roughness obtained by measurement with an atomic force microscope was 1.3 nm or more and 15 nm or less. On the other hand, in a region of 1 μm×1 μm of the surface of the back surface conductive film 23 of Comparative Examples 1 and 2, the maximum height (Rmax) of the surface roughness obtained by measurement with an atomic force microscope was outside the range of 1.3 nm or more and 15 nm or less.

Then, the surface of the back surface conductive film 23 of Examples 1 to 5 and Comparative Examples 1 and 2 obtained as described above was inspected for a defect using a mask blanks defect inspection apparatus (MAGICS M1350) manufactured by Lasertec Corporation. Table 2 and Table 3 show results of the defect inspection. In Table 2 and Table 3, "○" means that the inspection was able to be made and "×" means that the inspection was not able to be made (the inspection was discontinued due to an overflow of the number of detected defects). As is clear from Table 2, in the case of Comparative Example 1, the number of detected defects was too large and an overflow was caused, and thus, the defect inspection was not able to be made. This suggests that, when the value of $(BA_{70}-BA_{30})/(BD_{70}-BD_{30})$ in the bearing curve was 10.979(%/nm) and less than 20(%/nm) as in the case of Comparative Example 1, the number of detected apparent defects increased due to pseudo defects, and thus, measurement by a defect inspection apparatus was impossible.

Figure 11:
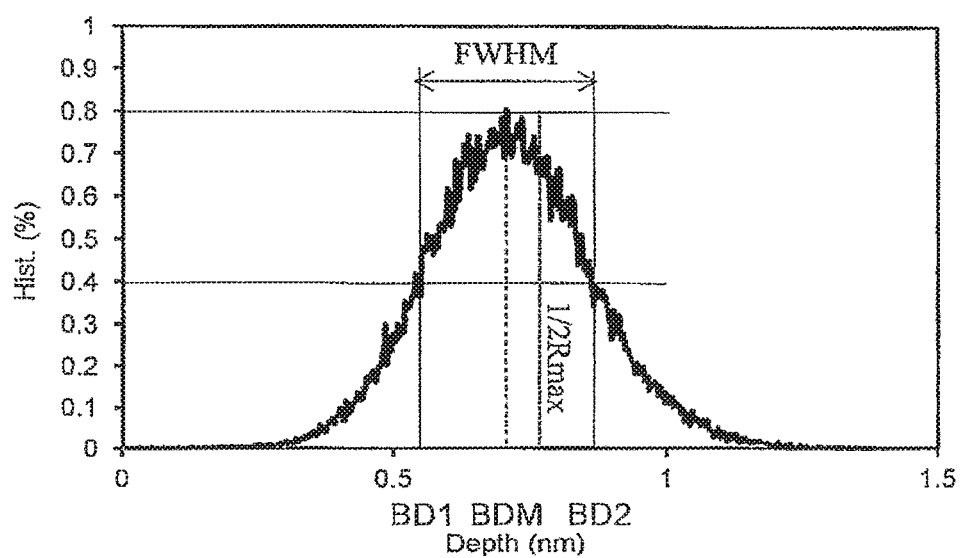
FIG. 11 is a graph for showing a frequency distribution in which a relationship between a bearing depth (Depth) (nm) of Example 1 and a frequency (Hist.) (%) thereof is plotted.

FIG. 11 is a graph for showing a frequency distribution in which a relationship between the bearing depth (nm) of Example 1 and a frequency (%) thereof is plotted. The vertical axis (Hist.) of the graph denotes the frequency (%) and the horizontal axis (Depth) denotes the bearing depth (nm).

From the graph of FIG. 11, an absolute value of the bearing depth (BDM) (nm) corresponding to a midpoint of a full width at half maximum FWHM (in the example shown in FIG. 11, the dotted line on which the bearing depth is (BD1+BD2)/2) and an absolute value (nm) of the bearing depth corresponding to ½ of the maximum height (Rmax) (in the example shown in FIG. 11, shown as the straight line with "½Rmax" that is in parallel with the vertical axis) were determined. As a result, the bearing depth (nm) corresponding to the midpoint of the full width at half maximum FWHM was 0.707 nm, and the absolute value (nm) of the bearing depth corresponding to ½ of the maximum height (Rmax) was 0.77 nm. Therefore, it was confirmed that the surface of the CrN film of Example 1 had a surface geometry in which the absolute value of the bearing depth corresponding to the midpoint of the full width at half maximum was smaller than the absolute value of the bearing depth corresponding to ½ of the maximum height (Rmax).

The number of defects of 0.2 μm or more was determined before the surface of the back surface conductive film of Example 1 was chucked by an electrostatic chuck and after the chucking and dechucking were repeated five times by using a defect inspection apparatus (MAGICS 1350 manufactured by Lasertec Corporation), and increase in the number was determined. The measurement region was a region of 132 mm×132 mm at the center of the back surface conductive film. As a result, the increase in the number of defects was 54, which was less than 100, and a satisfactory result was obtained.

Then, the surface of the back surface conductive film of Example 1 after the chucking and dechucking were repeated five times was cleaned with an alkaline cleaning liquid. The number of defects of 0.2 μm or more was reduced to 7, and a satisfactory surface state was able to be obtained.

Then, with regard to Example 2 and Example 5, similarly, the absolute value of the bearing depth (nm) corresponding to the midpoint of the full width at half maximum FWHM and the absolute value (nm) of the bearing depth corresponding to ½ of the maximum height (Rmax) were determined. As a result, in the case of Example 2, the bearing depth (nm) corresponding to the midpoint of the full width at half maximum FWHM was 5.10 nm, and the absolute value (nm) of the bearing depth corresponding to ½ of the maximum height (Rmax) was 4.08 nm. On the other hand, in the case of Example 5, the bearing depth (nm) corresponding to the midpoint of the full width at half maximum FWHM was 1.42 nm, and the absolute value (nm) of the bearing depth corresponding to ½ of the maximum height (Rmax) was 1.42 nm. Therefore, it was confirmed that each of the surface of the CrN film of Example 2 and the surface of the TaN film of Example 5 had a surface geometry in which the absolute value of the bearing depth corresponding to the midpoint of the full width at half maximum was equal to or larger than the absolute value of the bearing depth corresponding to ½ of the maximum height (Rmax).

The number of defects of 0.2 μm or more was determined before each of the surfaces of the back surface conductive films of Example 2 and Example 5 was chucked by an electrostatic chuck and after the chucking and dechucking were repeated five times by using a defect inspection apparatus (MAGICS 1350 manufactured by Lasertec Corporation), and increase in the number was determined. The measurement region was a region of 132 mm×132 mm at the center of the back surface conductive film. As a result, the increase in the number of defects was 788 in Example 2 and the increase in the number of defects was 176 in Example 5, which were each more than 100.

However, when each of the surfaces of the back surface conductive films of Example 2 and Example 5 after the chucking and dechucking were repeated five times was cleaned with an alkaline cleaning liquid, the number of defects of 0.2 μm or more was reduced to 23 in Example 2 and reduced to 11 in Example 5, and a satisfactory surface state was able to be obtained.

<Manufacture of Mask 40 for Evaluating Coordinate Measurement>

A resist was applied to the surface of the absorber film 24 of the reflective mask blank 30 of Examples 1 to 5 and Comparative Examples 1 and 2 by spin coating, and, through heating and cooling steps, a resist film having a thickness of 150 nm was formed. Then, a resist pattern was formed through steps of drawing and developing a pattern 42 for evaluating coordinate measurement (simply referred to as "evaluation pattern 42") illustrated in FIG. 10.

FIG. 10 is an illustration of the reflective mask 40 (mask 40 for evaluating coordinate measurement) having the evaluation pattern 42. In the reflective mask 40 illustrated in FIG. 10, 20×20 (400 in total) holes of the evaluation pattern 42 (hole pattern 42, the holes being in the shape of a square having a side of 500 nm) were equidistantly formed in the region of 132 mm×132 mm in the absorber film 24. Note that, as illustrated in FIG. 10, the cross-shaped fiducial mark 44 (having a length of 550 μm) described above was formed at the four corners outside the region of 132 mm×132 mm.

Specifically, for the purpose of manufacturing the mask 40 for evaluating coordinate measurement, first, a coordinate measuring machine (IPRO manufactured by KLA-Tencor Corporation) was used to measure coordinates of the fiducial marks 44 (intersections of the crosses) formed in the reflective mask blank 30. Then, a resist liquid was applied onto the absorber film 24 of the reflective mask blank 30 to form a resist film. Then, the evaluation pattern 42 described above was drawn using an electron beam (EB lithography) on the resist film and development was performed to form a resist pattern. In the electron beam lithography of the evaluation pattern 42, the fiducial marks 44 described above were formed also in the absorber film 24 and the resist film formed on the multilayer reflective film 21. The fiducial marks 44 were detected by the EB, and a correlation between coordinates of the fiducial marks 44 and of the evaluation pattern 42 was examined. Reference coordinates of the fiducial marks 44 were intersections of the crosses of the fiducial marks 44. Then, the absorber film 24 was dry etched using a Cl-based gas (for example, a gas mixture of chlorine ($Cl_2$) and oxygen ($O_2$)) with the resist pattern being used as a mask to form the absorber pattern 27. Finally, the resist film was separated to obtain the mask 40 for evaluating coordinate measurement.

<Method of Evaluating Measurement Accuracy of Evaluation Pattern 42>

After the coordinates of the fiducial marks 44 of the mask 40 for evaluating coordinate measurement were measured using a coordinate measuring machine (IPRO manufactured by KLA-Tencor Corporation), coordinates of the evaluation pattern 42 were measured to measure measurement accuracy of the evaluation pattern 42 (coordinates of the hole pattern 42). In Table 2 and Table 3, measurement accuracy of the evaluation pattern 42 obtained by the measurement is shown. As is clear from Table 2 and Table 3, in the case of Comparative Example 2, the measurement accuracy of the evaluation pattern 42 was 8.0 nm, which was larger than those in Examples 1 to 5. This suggests that, when the value of $(BA_{70}-BA_{30})/(BD_{70}-BD_{30})$ in the bearing curve was 275.86(%/nm) and more than 260(%/nm) as in the case of Comparative Example 2, slippage of the mask for evaluation was caused in the measurement using the coordinate measuring machine to lower the positional accuracy of the evaluation pattern 42.

<Manufacture of Reflective Mask 40 and Manufacture of Semiconductor Device>

A resist was applied to the surface of the absorber film 24 of the reflective mask blank 30 of Examples 1 to 5 and Comparative Examples 1 and 2 by spin coating, and, through heating and cooling steps, a resist film having a thickness of 150 nm was formed. Then, a resist pattern was formed through steps of drawing and developing a desired pattern. The absorber film 24 was patterned by predetermined dry etching with the resist pattern being used as a mask to form the absorber pattern 27 on the protective film 22. Note that, when the absorber film 24 is a TaBN film, dry etching can be performed using a gas mixture of $Cl_2$ and He. Further, when the absorber film is a laminated film of two layers of a TaBN film and a TaBO film, the dry etching can be performed using a gas mixture of chlorine ($Cl_2$) and oxygen ($O_2$) (mixture ratio (flow rate ratio) of chlorine ($Cl_2$):oxygen ($O_2$)=8:2).

After that, the resist film was removed, and cleaning with a chemical solution was performed similarly to the above, to thereby manufacture the reflective mask 40 of Examples 1 to 5 and Comparative Examples 1 and 2. Note that, in the drawing step described above, in accordance with defect data prepared based on the fiducial marks, drawing data was corrected so that the absorber pattern 27 was arranged at a location at which a critical defect exists based on the defect data and the transferred pattern (circuit pattern) data, to thereby manufacture the reflective mask 40. The obtained reflective mask 40 of Examples 1 to 5 and Comparative Examples 1 and 2 was inspected for a defect using a highly sensitive defect inspection apparatus ("Teron 610" manufactured by KLA-Tencor Corporation).

Slippage of the back surface conductive film due to a mount of the coordinate measuring machine was inhibited, and the positional accuracy when the pattern was measured using a coordinate measuring machine was satisfactory. Thus, in measurement of the reflective mask 40 of Examples 1 to 5 using a highly sensitive defect inspection apparatus, the number of defects was small and practically no problem was presented. On the other hand, in the case of the reflective mask 40 of Comparative Examples 1 and 2, slippage of the back surface conductive film due to the mount of the coordinate measuring machine lowered the positional accuracy when the pattern was measured using the coordinate measuring machine. Thus, a large number of defects were detected through measurement using a highly sensitive defect inspection apparatus.

Then, with use of the reflective mask 40 of Examples 1 to 5 and an exposure apparatus, a pattern was transferred to a resist film formed on a transfer target that was a semiconductor substrate, and after that, a wiring layer was patterned and a semiconductor device was manufactured. A semiconductor device without a pattern defect was able to be manufactured.

Note that, in manufacturing the substrate 20 provided with a multilayer reflective film and the reflective mask blank 30 described above, after the multilayer reflective film 21 and the protective film 22 were formed on the main surface of the substrate 10 for a mask blank on the side on which the transfer pattern was to be formed, the back surface conductive film 23 was formed on the back surface on the opposite side of the main surface, but this invention is not limited thereto. After the back surface conductive film 23 is formed on the main surface of the opposite side to the main surface on the side on which the transfer pattern of the substrate 10 for a mask blank is to be formed to prepare the conductive film coated substrate, the multilayer reflective film 21, and further, the protective film 22 may be formed on the main surface on the side on which the transfer pattern is to be formed to manufacture the substrate 20 provided with a multilayer reflective film, and the absorber film 24 may be further formed on the protective film 22 to manufacture the reflective mask blank 30. In the case of the reflective mask blank 30 manufactured by this method, the number of defects on the surface of the back surface conductive film was slightly larger than that in examples described above, but the measurement accuracy of the coordinates of the evaluation pattern was 2.5 nm or less, and it was confirmed that an effect similar to that of the examples described above was able to be obtained. When defect inspection is made under a state in which a mount of a defect inspection apparatus abuts the back surface conductive film 23 of the substrate 20 provided with a multilayer reflective film or the reflective mask blank 30, the positional accuracy of a detected defect in defect inspection of the substrate 20 provided with a multilayer reflective film and the reflective mask blank 30 is also improved, which is preferred.

In the above, the invention made by the inventors of this invention has been described by way of the embodiments, but this invention is not limited to the above-mentioned embodiments, and it should be understood that various changes are possible within the scope not departing from the gist of this invention.

This application claims priority from Japanese Patent Application No. 2013-202494, filed on Sep. 27, 2013, the entire disclosure of which is incorporated herein.

DESCRIPTION OF REFERENCE NUMERALS 10 substrate for mask blank
20 substrate provided with multilayer reflective film
21 multilayer reflective film
22 protective film
23 back surface conductive film
24 absorber film
25 etching mask film
26 multilayer firm for mask blank
27 absorber pattern
30 reflective mask blank
40 reflective mask (mask for evaluating coordinate measurement)
42 evaluation pattern (hole pattern)
44 fiducial mark
50 substrate provided with conductive film

The invention claimed is:

1. A conductive film coated substrate comprising:
a substrate for a mask blank for use in lithography; and
a conductive film formed on one main surface of the substrate;
wherein, in a frequency distribution chart where a relationship between a bearing depth obtained by measuring, with an atomic force microscope, a region of 1 µm×1 µm of a surface of the conductive film and a frequency (%) of the bearing depth is plotted, an absolute value of a bearing depth corresponding to a center of a full width at half maximum, which is determined from an approximated curve drawn through the plotted points or a highest frequency of the plotted points, is smaller than an absolute value of the bearing depth corresponding to ½ of a maximum height (Rmax) of surface roughness of the surface of the conductive film, and the maximum height (Rmax) is 1.3 nm or more and 15 nm or less.

2. A conductive film coated substrate according to claim 1, wherein a root means square roughness (Rms) of surface roughness of the surface of the conductive film is 0.15 nm or more and 1.0 nm or less.

3. A conductive film coated substrate according to claim 1, wherein the region of 1 µm×1 µm of the surface of the conductive film is in an arbitrary location in a region of 148 mm×148 mm.

4. A multilayer reflective film coated substrate comprising a multilayer reflective film formed by alternately laminating a high refractive index layer and a low refractive index layer, wherein the multi-layer reflection film is formed on a main surface of the conductive film coated substrate according to claim 1 on a side opposite to a side on which the conductive film is formed.

5. A multilayer reflective film coated substrate according to claim 4, further comprising a protective film formed on the multilayer reflective film.

6. A reflective mask blank comprising an absorber film formed on the multilayer reflective film of the multilayer reflective film coated substrate according to claim 4.

7. A reflective mask blank comprising an absorber film formed on the protective film of the multilayer reflective film coated substrate according to claim 5.

8. A reflective mask comprising an absorber pattern provided on the multilayer reflective film, wherein the absorber pattern is formed by patterning the absorber film of the reflective mask blank according to claim 6.

9. A reflective mask comprising an absorber pattern provided on the protective film, wherein the absorber pattern is formed by patterning the absorber film of the reflective mask blank according to claim 7.

10. A method of manufacturing a semiconductor device, comprising a step of performing a lithography process with the reflective mask according to claim 8 using an exposure apparatus to form a transfer pattern on a transfer target.

11. A method of manufacturing a semiconductor device, comprising a step of performing a lithography process with the reflective mask according to claim 9 using an exposure apparatus to form a transfer pattern on a transfer target.

* * * * *